(12) United States Patent
Lee et al.

(10) Patent No.: US 8,958,035 B2
(45) Date of Patent: Feb. 17, 2015

(54) MASK FOR PHOTOALIGNING AN ALIGNEMENT LAYER, PHOTOALIGNMENT METHOD USING THE SAME, AND LIQUID CRYSTAL DISPLAY HAVING THE PHOTOALIGNED ALIGNEMENT LAYER

(75) Inventors: Jun-Woo Lee, Anyang-si (KR); Jin-Soo Jung, Hwaseong-si (KR); Suk-Hoon Kang, Seoul (KR); Tae-Ho Kim, Seoul (KR); Soo-Ryun Cho, Gunpo-si (KR); Baek-Kyun Jeon, Yongin-si (KR)

(73) Assignee: Samsung Display Co., Ltd. (KR)

( * ) Notice: Subject to any disclaimer, the term of this patent is extended or adjusted under 35 U.S.C. 154(b) by 489 days.

(21) Appl. No.: 12/874,890

(22) Filed: Sep. 2, 2010

(65) Prior Publication Data

US 2011/0085097 A1 Apr. 14, 2011

(30) Foreign Application Priority Data

Oct. 12, 2009 (KR) ........................ 10-2009-0096937

(51) Int. Cl.
- *G02F 1/1337* (2006.01)
- *G03F 1/00* (2012.01)
- *G02F 1/1362* (2006.01)
- *G02F 1/1343* (2006.01)

(52) U.S. Cl.
CPC .......... *G03F 1/144* (2013.01); *G02F 1/133788* (2013.01); *G02F 1/13624* (2013.01); *G02F 2001/133746* (2013.01); *G02F 2001/133757* (2013.01); *G02F 2001/134345* (2013.01)
USPC ............ 349/128; 349/123; 349/124; 349/129

(58) Field of Classification Search
USPC .................. 349/128–129, 123–124
See application file for complete search history.

(56) References Cited

U.S. PATENT DOCUMENTS

| | | | |
|---|---|---|---|
| 7,075,607 B2 * | 7/2006 | Kim et al. ..................... | 349/124 |
| 7,209,203 B2 | 4/2007 | Son | |
| 2006/0087605 A1 * | 4/2006 | Sasabayashi et al. ......... | 349/127 |
| 2009/0002618 A1 * | 1/2009 | Lee et al. ...................... | 349/129 |
| 2010/0085524 A1 * | 4/2010 | Nakagawa ..................... | 349/124 |
| 2010/0225864 A1 * | 9/2010 | Inoue et al. .................... | 349/123 |

FOREIGN PATENT DOCUMENTS

| | | |
|---|---|---|
| JP | 10-104630 | 4/1998 |
| JP | 2004-085612 A | 3/2004 |
| JP | 4108662 | 2/2005 |
| JP | 3794393 | 4/2006 |
| JP | 3844234 | 8/2006 |
| JP | 2007-034151 A | 8/2007 |
| JP | 2008-076825 | 4/2008 |
| JP | 2009-042742 A | 2/2009 |
| KR | 00488957 B1 | 5/2005 |
| KR | 1020050110369 A | 11/2005 |

(Continued)

*Primary Examiner* — Charles Chang
(74) *Attorney, Agent, or Firm* — Innovation Counsel LLP

(57) ABSTRACT

A wide variety of different alignment polar angles can be created in the alignment layers of a liquid crystal display with just a small number of UV exposure steps by using one or a combination of overlappable UV masks, where the one or more combinations of overlappable UV masks simultaneously define a maximal transmission region, an intermediate transmission region and a nontransmitting (blocking) region. UV rays are irradiated through masks in different irradiation directions while the mask or masks are disposed in different orientations.

14 Claims, 25 Drawing Sheets

(56) References Cited

FOREIGN PATENT DOCUMENTS

| KR | 1020070045751 A | 5/2007 |
|---|---|---|
| KR | 1020080001401 A | 1/2008 |
| KR | 1020080015619 A | 2/2008 |
| KR | 10200800530 A | 6/2008 |
| WO | 2007/086474 A1 | 2/2007 |

\* cited by examiner

MASK FOR PHOTOALIGNING AN ALIGNEMENT LAYER, PHOTOALIGNMENT METHOD USING THE SAME, AND LIQUID CRYSTAL DISPLAY HAVING THE PHOTOALIGNED ALIGNEMENT LAYER

CROSS-REFERENCE TO RELATED APPLICATION

This application claims priority to and the benefit of Korean Patent Application No. 10-2009-0096937 filed in the Korean Intellectual Property Office on Oct. 12, 2009, the entire contents of which application are incorporated herein by reference.

BACKGROUND (a) Field of Disclosure

The present disclosure of invention relates to a mask that is usable for photoaligning an alignment layer of a Liquid Crystal Display (LCD), a photoalignment method using the same, and a liquid crystal display having the photoaligned alignment layer.

(b) Description of Related Technology

A liquid crystal display (LCD) is one of the most widely used flat panel displays (FPD) in the display arts. The LCD is typically composed of two display panels on which field generating electrodes are provided such as pixel electrodes on one panel and a common electrode formed on the other. A liquid crystal layer is generally interposed between the two display panels. In the liquid crystal display, voltages are applied to the field generating electrodes so as to generate electric fields extending through the liquid crystal layer, and then the alignments of liquid crystal molecules of the liquid crystal layer are determined by the strength and/or direction of the electric fields. Polarization of incident light rays passing through the liquid crystal layer may thus be controlled, thereby helping to form a desired image for display.

The orientation of liquid crystal molecules of the liquid crystal display are initially aligned in a predetermined direction, when an electrical field is not present, by use of an alignment layer formed for example with a rubbing process. Also, the liquid crystal molecules of the liquid crystal display may be initially aligned to have a pre-tilt angle by use of rubbing within a vertical alignment (VA) type of liquid crystal display such that the rotating direction of the liquid crystal molecules may be determined when next applying an electric voltage of given polarity.

The pre-tilt angle can be realized by the combination of a contact rubbing method and a light exposure alignment method. The alignment layer is rubbed by physical pressure using a roller in the contact rubbing method, and the alignment layer is then irradiated by ultraviolet (UV) rays in the light exposure alignment method, to thus define or refine the pre-tilt angle.

The photoalignment process can be designed to help increase the viewing angles of the display as compared to that which occurs when a constant same alignment angle is used symmetrically and uniformly throughout.

The above information disclosed in this Background section is only for enhancement of understanding of the background of the present disclosure and it may contain information that does not form prior art that was already known to persons of ordinary skill in the pertinent art.

SUMMARY

The present disclosure provides one or an overlapped set of photoalignment masks for use in a corresponding photoalignment process where the photoalignment process may be used to increase a practical viewing angle of a corresponding Liquid Crystal Display (LCD) device whose alignment layers have been aligned at least partly by the photoalignment process.

One or a plurality of overlapped photoalignment masks are provided in accordance with the present disclosure where the one mask or overlapped plural masks effectively provide a first transmission region through which predetermined photoalignment wavelengths (e.g., UV light rays) can pass with substantially maximal transmissivity (e.g., almost 100% of input energy is transmitted through the region), a second transmission region (translucent region) through which the predetermined photoalignment wavelengths can pass with a transmissivity factor substantially less than the maximal transmissivity factor (e.g., 100%) but more than an essentially zero transmissivity, and a blocking region that substantially blocks the predetermined photoalignment wavelengths and thus has an essentially zero transmissivity factor. The blocking region is shaped and dimensioned so that it can cover an area of an alignment layer that has been previously exposed to the predetermined photoalignment wavelengths (e.g., UV light rays) where those already-exposed-to wavelengths passed through the first and second transmission regions.

More specifically, a particular single photoalignment mask in accordance with the disclosure includes a first, maximal transmission region, a second intermediate transmission region (hereafter also translucent region) having light transmittance factor less than that of the first transmission region, and a blocking region that substantially blocks the light of the predetermined photoalignment wavelengths (e.g., UV light rays), wherein in one class of embodiments, the transmittance of the translucent region is in the range of about 25%-70% of the transmittance of the first transmission region.

The sum of the areas occupied with the maximal transmission region and the translucent region in the photoalignment mask may be the same as the area of the blocking region.

A photoalignment masks set includes a first mask having a blocking region that blocks light and first maximal transmission regions that are alternately disposed relative to the blocking region, and a second mask having a second maximal transmission region and translucent regions having less light transmittance than the second maximal transmission region and that are alternately disposed relative to the second maximal transmission region, wherein the transmittance of the translucent regions is in the range of 25%-70% of that of the second maximal transmission region.

A method for photo-aligning an alignment layer according to the present disclosure includes: firstly disposing a first mask including a translucent region, a maximal transmission region, and a blocking region on a first alignment layer; firstly irradiating UV rays to the first alignment layer through the first mask for alignment in a first direction; secondly disposing the first mask in a different state from the first disposing but aligned relative to the first disposing; and secondly irradiating UV rays to the first alignment layer through the first mask for alignment in a second direction.

The first direction and the second irradiation directions may be opposite to each other.

The translucent region and the maximal transmission region of the first mask in the second disposing may be disposed at the position of the blocking region of the first mask in the first disposing.

The method may further include: thirdly disposing a second mask including a translucent region, a maximal transmission region, and a blocking region on the second alignment layer; thirdly irradiating UV rays to the second alignment layer through the second mask for alignment in a third direction, fourthly disposing the second mask differently from the third disposing; and fourthly irradiating UV rays to the second alignment layer through the second mask for aligning in a fourth direction, wherein the third direction and the fourth direction are perpendicular to the first direction and the second direction in the state in which the first alignment layer and the second alignment layer are combined.

The third direction and the fourth irradiation directions may be opposite to each other.

The UV rays may be a linearly polarized UV rays (e.g., lights passed through a collimator) or partially polarized UV rays.

The wavelength of the UV rays may be in the range of 270 nm-360 nm, and the output signal irradiation energy may be in the range of 10 mJ-5000 mJ.

A method for photo-aligning an alignment layer includes: firstly disposing a first mask including a first maximal transmission region and a first blocking region on a first alignment layer; secondly disposing a second mask including a second maximal transmission region and a first translucent region for the second maximal transmission region and the first translucent region to overlap the first maximal transmission region and the first blocking region; irradiating UV rays to the first alignment layer through the first and second masks for aligning the first alignment layer in a first irradiation direction; thirdly disposing the first mask in a different state from that of the first disposing; disposing the first mask and the second mask to overlap the first maximal transmission region and the blocking region of the first mask with the second maximal transmission region and the translucent region of the second mask, and fourth disposing the second mask in a different state from that of the second disposing; and secondly irradiating UV rays to the first alignment layer through the first and second masks to align the first alignment layer in the second irradiation direction.

The first direction and the second irradiation directions may be opposite to each other.

The method may further include: fifthly disposing a third mask including a third maximal transmission region and a second blocking region on the second alignment layer; sixthly disposing a fourth mask including the fourth maximal transmission region and the second translucent region for the fourth maximal transmission region and the second translucent region to overlap the third maximal transmission region and the second blocking region; thirdly irradiating UV rays to on the second alignment layer through the third and the fourth masks to align the second alignment layer in the third direction; seventhly disposing the third mask in a different state from that of the fifth disposing; disposing the third maximal transmission region and the second blocking region of the third mask to overlap the fourth maximal transmission region and the second translucent region of the fourth mask, and eighthly disposing the fourth mask in a different state from that of the sixth disposing; and fourthly irradiating UV rays to the second alignment layer through the third and fourth masks to align the second alignment layer in the fourth irradiation direction.

The third direction and the fourth irradiation directions may be opposite to each other.

The third direction and the fourth irradiation directions may be perpendicular to the first irradiation direction and the second irradiation direction.

The UV rays may be linearly polarized UV rays or a partially polarized UV rays.

The wavelength of the UV rays may be in the range of 270 nm-360 nm, and the irradiation energy is in the range of 10 mJ-5000 mJ.

A liquid crystal display according to an exemplary embodiment of the present invention includes a first substrate and a second substrate facing each other, and a liquid crystal layer formed between the first substrate and the second substrate and including liquid crystal molecules, wherein the liquid crystal layer includes a plurality of regions having different alignment azimuth angles of the liquid crystal molecules, and the plurality of regions respectively include at least two sub-regions having different alignment polar angles of the liquid crystal molecules.

The alignment polar angle may be more than 85° and less than 90°.

The number of regions may be 4 and there may be two sub-regions per region, and the alignment polar angle of two sub-regions may respectively be 88° and 89°.

Each region may include a first region with an alignment azimuth angle of 45°, a second region with a larger alignment azimuth angle than the alignment azimuth angle of the first region, and a third region having a smaller alignment azimuth angle than the alignment azimuth angle of the first region, and the area of the first region may be wider than that of the second and third regions.

The voltage applied to the first region may be lower than that of the second and third regions.

As described above, according to an exemplary embodiment of the present invention, at least two pretilt angles may be formed through one irradiation step by using a photomask including a translucent region. Accordingly, the liquid crystal molecules may be easily aligned in the various directions such that the side view visibility of the liquid crystal display may be improved.

DETAILED DESCRIPTION

Figure 1:
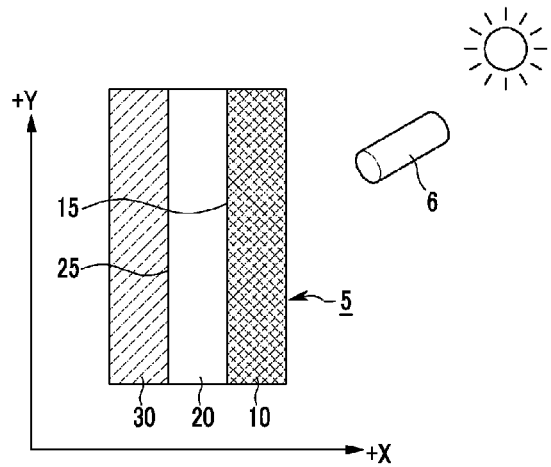
FIG. 1 is a plan view showing areas of a photoalignment mask according to an exemplary first embodiment.

The present disclosure of invention will be provided more fully hereinafter with reference to the accompanying drawings, in which exemplary embodiments are shown. As those skilled in the art would realize from reading the disclosure, that the described embodiments may be modified in various different ways, all without departing from the spirit or scope of the present teachings.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 shows a plan view of a major surface portion of a photoalignment mask 5 according to an exemplary embodiment. The photoalignment mask 5 is shown as a planar structure lying parallel to a reference plane having X and Y axes as shown. A collimated irradiator 6 is also shown in FIG. 1. However, this collimated irradiator 6 is to be understood to be positioned above the mask 5 and to be tilted to point down at the mask 5 (and at an underlying alignment layer which is not shown) where the tilt of the collimated irradiator 6 is other than being parallel to the Z axis. (The Z axis is not shown but is understood to be orthogonal to the illustrated X and Y axes.)

Referring to FIG. 1, the photoalignment mask 5 according to the exemplary embodiment includes three regions having respective different transmittances for the to-be-passed through wavelengths (e.g., UV wavelengths) that are emitted from the collimated irradiator 6. The mask 5 has a light blocking first region 10 that has light transmittance of essentially 0%. The mask 5 has a high transmission region 20 which has light transmittance of substantially 100%, and the mask 5 has a translucent or lower transmittance region 30 which has a light transmittance factor of approximately 25%-50% for the to-be-passed through wavelengths (e.g., UV wavelengths).

The boundary 15 (e.g., line) between the blocking region 10 and the highest transmission region 20 defines a first irradiation amount difference border 15. The boundary 25 (e.g., line) between higher transmission region 20 and substantially lower transmission region 30 defines a second irradiation amount difference border 25. Such irradiation difference borders, 15 and 25 can be used to create photo-rubbed regions of different photo-rubbing amounts as will be described in more detail below.

The substantially lower but above zero transmittance of the translucent region 30 in FIG. 1 can be defined and controlled for example by using a lattice pattern or a thin film having a middle transmittance and/or a middle thickness relative to the fully blocking material used in region 10. The higher transmission region 20 is disposed between the blocking region 10 and the translucent region 30, and the sum of the area that the maximal transmission region 20 and the translucent region 30 occupy in the mask 5 is equal to the area that the blocking region 10 occupies. Accordingly, two exposure instances of the mask (e.g., in orientations 5a and 5b of FIG. 3) can be applied in temporally sequential and positionally overlaid manner where the second instance (5b of FIG. 3) is rotated 180 degrees in its XY plane as compared to the first exposure instance (5a) and where the positional overlay is such that areas 30 and 20 of second instance (5b) can matchingly overlap area 10 of the first instance (5a) while areas 30 and 20 of the first instance (5a) similarly matchingly overlap area 10 of the second instance (5b). See for example FIG. 3.

Figure 3:
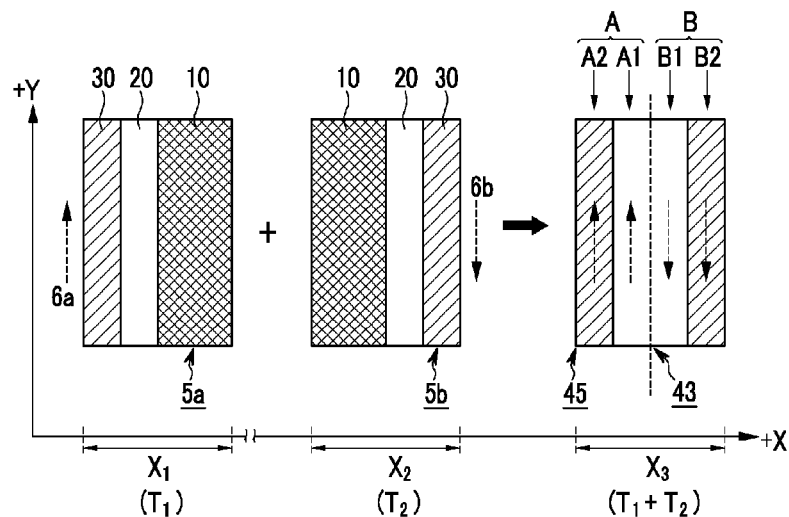
FIG. 3 is a view showing a method for photo-aligning a lower alignment layer of the display by using the photoalignment mask shown in FIG. 1.

More specifically, and as better shown in FIG. 3, when liquid crystal molecules of a given display substrate (not shown) are caused to be pre-aligned by using the mask (in respective overlaid orientations 5a and 5b) in combination with the collimated irradiator 6 (tilted in respective photo-push directions 6a and 6b) all as part of a light-implemented alignment method, although the same incident light energy (e.g., UV rays emitted from collimated irradiator 6 but in different push directions 6a and 6b) is irradiated to the mask areas, an alignment polar angle of the liquid crystal molecule that is aligned by the light-treated alignment layer of the substrate is changed for areas that are photo-rubbed in direction 6b as opposed to direction 6a. It is to be understood that, as used herein, the term, "alignment polar angle" means an average polar orientation angle at which the liquid crystal molecules meet with the irradiation-treated substrate in a same-way rubbed region of the alignment layer of the substrate. Accordingly, the liquid crystal molecules may be aligned to have various initial polar slopes in different regions of the irradiation-treated substrate dependant on how the multi-region mask 5 and collimated irradiator 6 are oriented relative to the substrate during each of plural exposure steps and corresponding exposure times (e.g., T1 and T2). The variation provided by creating a variety of initial alignment angles or slopes helps to improve the range of practical viewing angles provided by the corresponding LCD apparatus.

Next, a manufacturing method of a liquid crystal display using the mask 5 and collimated irradiator 6 of FIG. 1 will be described with reference to FIG. 2 to FIG. 4.

Figure 2:
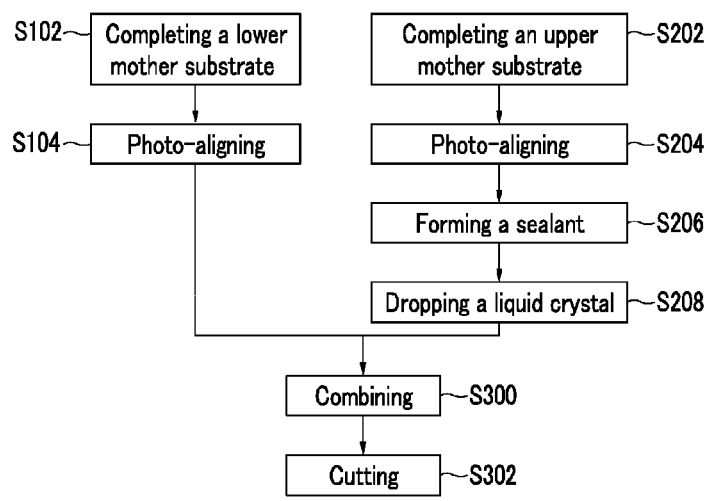
FIG. 2 is a flowchart explaining a sequence of steps for manufacturing a liquid crystal cell for a liquid crystal display according to the present disclosure.

FIG. 2 is a flowchart explaining a sequence of steps for manufacturing a plurality of liquid crystal cells for use in respective liquid crystal display devices according to the present disclosure. FIG. 3 is a view showing a method for photo-aligning a lower alignment layer by using the photo-alignment mask 5 shown in FIG. 1 under mask orientations 5a and 5b and corresponding collimated irradiator orientations 6a and 6b. FIG. 4 is a view showing a method for photo-aligning an upper alignment layer by using the same photo-alignment mask 5 shown in FIG. 1 but with mask orientations 5d and 5c and corresponding collimated irradiator orientations 6d and 6c. A same XYZ reference frame is used for both of FIGS. 3 and 4. However the X axis ranges denoted as X1, X2 and X3 are understood to overlap each other. Mask orientation 5a is employed in time slot T1 while mask orientation 5b is employed in time slot T2. Similarly, irradiator orientation 6a is employed in time slot T1 while irradiator orientation 6b is employed in exposure time slot T2. The photo-treated alignment layer 45 remains in its X3 position during both of exposure time slots T1 and T2. (A similar arrangement is understood to occur for the method depicted in FIG. 4.)

Firstly, before photoalignment takes place and as shown in FIG. 2, upper and lower mother substrates are respectively completed through well-known processes (respective steps S102 and S202) up to the steps where alignment tilt angle is to be defined by light irradiation. The so-called upper and lower mother substrates may be afterwards diced to form individual and respective upper and lower panel substrates for respective LCD devices. The term "cell" refers to a repeated structure of the respective mother substrate. One meaning herein of the term "cell" can therefore be that the cell corresponds to the individual panel substrate that is cut out from its respective mother substrate to form a corresponding individual LCD device. The upper mother substrate includes one or more common electrodes, and may include one or more color filters for inclusion in respective LCD devices. Similarly, the lower mother substrate may include arrays of thin film transistors (TFTs) and corresponding pixel electrodes. The upper and lower mother substrates may be covered by various respective planarization and/or passivation layers including an outermost one that will come into direct contact with the liquid crystal molecules that will later be interposed between individual and respective upper and lower panel substrates for respective LCD devices. The outermost layers that will directly contact or otherwise affect the initial angles of the liquid crystal molecules are also referred to herein as the alignment layers.

After optional rubbing to define initial alignment attributes, next, the alignment layers formed in the respective upper and lower mother substrates are irradiated with linearly polarized ultraviolet (LPUV) rays supplied from collimated irradiator 6 or with UV rays that have been partially so polarized where the irradiation is carried out with use of the different orientations of mask 5 of FIG. 1 and the different orientations of collimated irradiator 6 (steps S104 and S204). The linearly polarized ultraviolet rays (6a or 6b of FIG. 3) are obliquely irradiated with respect to the surface of the alignment layer, thereby generating a directional photo-push effect similar to the physical rubbing push effect provided when the surface of the alignment layer is rubbed in a predetermined direction. The method in which the linearly polarized ultraviolet rays 6 are obliquely irradiated to the surface of the alignment layer (43 of FIG. 3) may be obtained by inclining the mother substrate or the collimated irradiator 6 for thereby irradiating with the linearly polarized ultraviolet rays where the rays are aimed partially towards the +Y or the −Y direction in FIG. 3 (or towards the +X or the −X direction in FIG. 4).

Photoalignment using the linearly polarized ultraviolet rays will now be described in regards to a first exemplary embodiment.

Firstly, referring to photoalignment for a lower alignment layer 45 which layer is shown in FIG. 3 and is understood to have a planar major surface at a Z axis position below the Z axis position of masks 5a and 5b; and which alignment layer 45 is understood to have been formed as the outermost layer in the lower mother substrate, then as shown in FIG. 3, the linearly polarized ultraviolet rays 6a are first irradiated during time slot T1 from the tilted collimated irradiator 6 and through the mask 5a and onto the alignment layer at an appropriate oblique angle (e.g., partially in the +Y direction and partially in the −Z direction). As described above, if the mask orientation 5a is used in combination with collimated irradiator orientation 6a, although the linearly polarized ultraviolet rays are irradiated just once during time slot T1, two regions, A1 and A2 having respectively different alignment polar angles may be obtained due to the difference of transmission factor of regions 20 and 30 in FIG. 1.

Accordingly in a next exposure step of FIG. 3 (during time slot T2), the linearly polarized ultraviolet rays are irradiated once again but this time with mask 5 in orientation 5b and the collimated irradiator 6 tilted according to orientation 6b (towards the −Y direction). Dashed line 43 represents an axis of symmetry corresponding to midway boundary 15 of FIG. 1.

When irradiating the alignment layer to have respective upward oriented polar angles (per exposure 5a) or downward oriented polar angles (per exposure 5b) the alignment polar angle of the liquid crystal molecules is also changed according to the amount of energy provided by the linearly polarized ultraviolet rays (6a and 6b) through the respective regions 20 and 30 of the mask 5 such that the energy amount of the linearly polarized ultraviolet rays is controlled to control the alignment angles or slopes of the liquid crystal molecules. In an exemplary embodiment of the present disclosure, to obtain an alignment polar angle of more than 85° to less than 90°, the irradiation wavelength of the UV rays 6a, 6b is in the range of about 270 nm-360 nm, and the emitted irradiation energy is in the range of about 10 mJ-5000 mJ (where nm is nanometer and mJ is milliJoule).

Thus, as shown in FIG. 3, if the mask 5 shown in FIG. 1 is used in accordance with exposure steps 5a/6a and 5b/6b, the first irradiation-treated region A and the second irradiation-treated region B of alignment layer 43 have respective different irradiation directions, and the irradiation-treated regions A and B include corresponding first alignment polar angle regions A1 and B1 of opposed directions, and corresponding second alignment polar angle regions A2 and B2 also respectively having different alignment polar angles. The dotted linear arrows in FIG. 3 indicate the respective directions (but not strengths) of the applied linearly polarized ultraviolet rays 6a, 6b.

Figure 4:
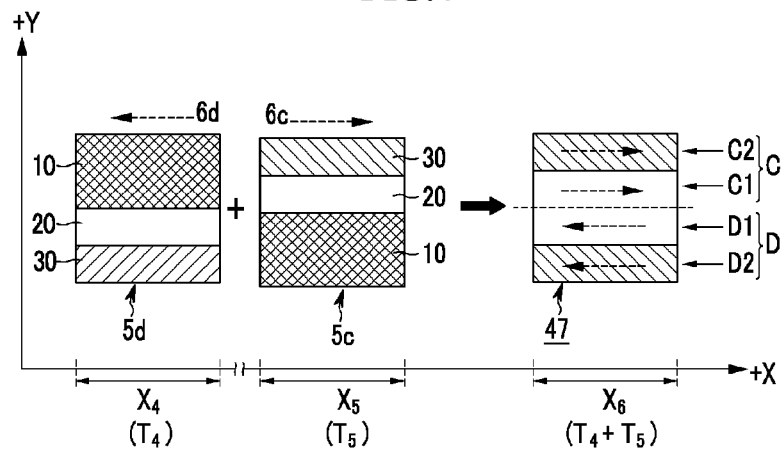
FIG. 4 a view showing, for the same reference frame, a method for photo-aligning an upper alignment layer of the display by using the photoalignment mask shown in FIG. 1.

Additionally, as shown in FIG. 4, the photoalignment method is applied to the upper alignment layer 47 formed in the upper mother substrate. The photoalignment of the upper mother substrate may be processed by using the mask 5 including the blocking region 10, the maximal transmission region 20, and the translucent region 30 that have different transmittances. Here however, the mask for the photoalignment is disposed to be aligned in orientations 5d and 5c which orientations are perpendicular to those direction used for photoalignment of the lower alignment layer. Similarly, the collimated irradiator 6 is partially tilted in respective directions 6d and 6c which orientations are perpendicular to those direction used for photoalignment of the lower alignment layer.

Thus, as shown in FIG. 4, a third irradiation region C and a fourth irradiation region D are formed in the regions of the upper alignment layer 47 where the linearly polarized ultraviolet rays are irradiated with the mask 5 being in the different orientations, 5d and 5c during the irradiation process. Each irradiation-treated region includes the third alignment polar angle regions C1 and D1, and the fourth alignment polar angle regions C2 and D2 having the different alignment polar angles as indicated by the dashed arrow lines. Again referring to FIG. 2, after the alignment layers of the upper and lower mother substrates are treated by respective photoalignment treatment processes (FIGS. 3 and 4 respectively), a sealing ring or the like and made of a material for adhesively and sealingly combining upper and lower LCD substrates together is formed on at least one of the mother substrates in each cell, where the sealing ring defines an interior region in each cell that will be filled with the liquid crystal material for that cell (step S206).

Next in FIG. 2, the liquid crystal material is dripped or otherwise deposited (step S208) into the respective cell regions, and the lower mother substrate and the upper mother substrate are aligned and adhesively combined (step S300).

Next, individual liquid crystal display assemblies are scribed out of the combined mother substrates according to predetermined cutting lines to thus be divided into a plurality of individual and operational liquid crystal cells (step S302).

If the liquid crystal material is alternatively filled into the cells by a liquid crystal injection method, the liquid crystal may be injected after dividing the combined mother substrates into the individual liquid crystal cells.

As described above, if the liquid crystal is aligned by using the mask 5 including the translucent layer, although the emitted and linearly polarized ultraviolet rays of same energy level are applied in each exposure (e.g., 5a and 5b; or 5d and 5c), the later-added liquid crystal molecules may come to be aligned to have the different initial alignment polar angles.

The reason why will be described in detail with reference to FIG. 5 to FIG. 6.

Figure 5:
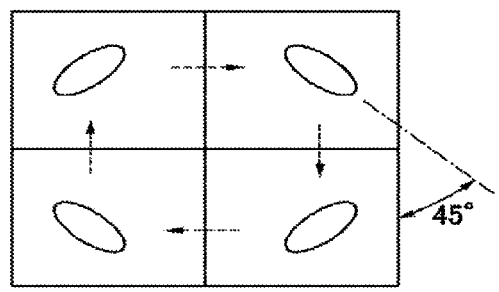
FIG. 5 is a view explaining alignment of liquid crystal molecules of a liquid crystal display after photoaligning according to a conventional method.
Figure 6:
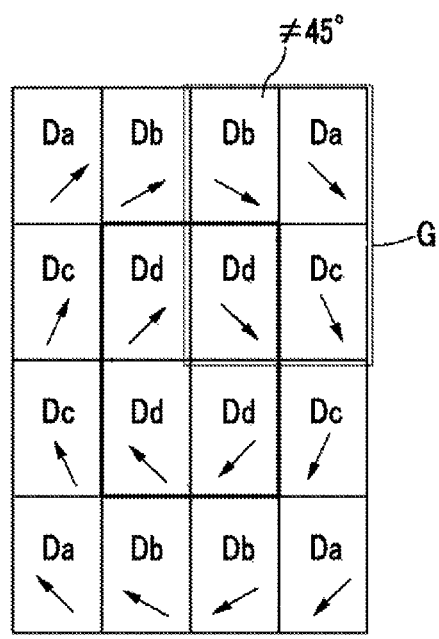
FIG. 6 is a view showing a divided region having different alignment directions of liquid crystal molecules as a result of photo-aligning according to an exemplary embodiment of the present disclosure.

FIG. 5 is a view explaining alignment of liquid crystal molecules of a liquid crystal display after photo-aligning according to a conventional photoalignment method, FIG. 6 is a view of a divided region having various alignment directions of liquid crystal molecules after being photo-aligned according to an exemplary embodiment (FIGS. 7-10, described shortly) of the present disclosure.

Referring to FIG. 5, a photoalignment mask (not shown) for the conventional photoalignment method only has a full (100%) transmission region covering 25% of its surface area (one quadrant) and a full blocking region (0%) covering 75% of its surface area (three quadrants). When such a one-quadrant-per exposure, conventional photoalignment mask (not shown) is used and rotated by 90 degrees for each respective quadrant, the liquid crystal molecules come to be aligned to have the different alignment polar angles of four quadrant regions, as shown in FIG. 5, wherein the upper and the lower alignment layers are both photo-aligned in the same way to have same directions of the collimated irradiator 6 per the dotted line arrows. Here, the absolute values of the alignment polar angles of the liquid crystal molecules of the four illustrated quadrant regions are equal to each other. Accordingly, the absolute values of the alignment azimuth angles according to the polar angles are also equal to each other at 45°.

However, when using a multi-region mask such as 5 of FIG. 1 (or such as masks 7 and 8 of respective FIGS. 7-8) and according to the present disclosure, then as shown in FIG. 6, as many as 16 sub-regions having respective different directions of Da, Db, Dc, and Dd may be obtained, where the central four sub-regions having the different azimuth angles Dd similar to what is shown in FIG. 5, respectively form a central group G (dashed box).

When one cell is photo-aligned by using a conventional mask (e.g., that of, but not shown in FIG. 5) having the same size, the one cell includes four mirror symmetrical regions according to the conventional art as shown in FIG. 5. However according to an exemplary embodiment of the present disclosure, different groups including G may be formed in one cell as shown in FIG. 6, and each group may include four mirror-wise symmetrical sub-regions such that the 16 sub-regions Da-Dd define four groups in one cell.

After the multi-angled photoalignment method is carried out according to the present disclosure, the alignment polar angles of the liquid crystal molecules may be obtained as various combinations such as those shown in Table 1.

Table 1 shows an alignment polar angle of upper and lower alignment layers in a sub-region after photoalignment according to an exemplary embodiment of the present disclosure.

TABLE 1

| | Lower alignment layer | Upper alignment layer |
|---|---|---|
| Da | 89 | 89 |
| Db | 88 | 89 |
| Dc | 89 | 88 |
| Dd | 88 | 88 |

Referring to Table 1, the alignment polar angle of the liquid crystal molecules of the lower and upper panels is the same at 89 degrees in the first sub-region Da, and the alignment polar angle of the liquid crystal molecules of the lower and upper panels is the same at 88 degrees in the fourth sub-region Dd. However, the alignment polar angles of the liquid crystal molecules of the lower and upper panels are different from each other at 88 or 89 degrees in the second and third sub-regions Db and Dc.

In this way, the alignment polar angles of the lower and upper alignment layers are caused to be different thereby obtaining the various azimuth angles as well as the conventional ones at 45°. The conventional art (FIG. 5) provides only the conventional 45° whereas alignment angles produced in accordance with the present disclosure include angles other than just 45°, this being substantively different from the conventional art.

Referring again to FIG. 5, the liquid crystal molecules (ovals) of the conventional art have the same alignment polar angle (dotted lines) for both the upper and lower substrate alignment layers such that the liquid crystal molecules are aligned to be 45 degrees for the vertical and horizontal lines when considered as a vector sum in four regions. However, in an exemplary embodiment of the present disclosure, the upper and lower alignment layers have the region including the different polar angles such that the sub-regions Db and Dc having the different azimuth angles that are formed as shown in FIG. 6, this being different from the conventional art.

As described above, in accordance with the present disclosure, the multi-regional mask 5 including the translucent region 30 is used such that the liquid crystal molecules are aligned to have the various alignment polar angles and alignment azimuth angles different from those obtainable with the conventional art. Accordingly, the practical viewing angle range of the liquid crystal display may be expanded.

Figure 7:
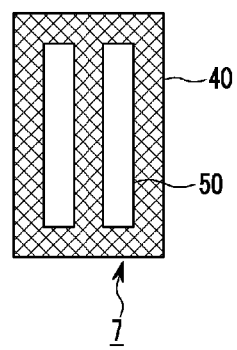
FIG. 7 and FIG. 8 are views showing a set of overlappable photoalignment masks according to another exemplary embodiment.
Figure 8:
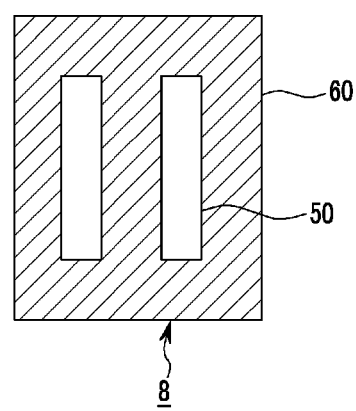

FIG. 7 and FIG. 8 are views of respective photoalignment masks (7 and 8) according to another exemplary embodiment.

The mask 7 of FIG. 7 includes a plurality of maximal transmission regions 50 with light transmittance of 100%, and the background blocking region 40 with light transmittance of 0% as a region except for the maximal transmission regions 50. Also, the mask 8 of FIG. 8 includes a plurality of maximal transmission regions 50 and a background translucent region 60 having transmittance of 25-50% except for the full transmission regions 50. The translucent region 60 may be formed with the same method as the translucent region 30 of FIG. 1. Although each of the masks of respective FIGS. 7 and 8 has only two different transmission regions, the masks 7-8 of respective FIGS. 7 and 8 can be overlaid one on top of the another during a an exposure time slot (e.g., T1) so as to effectively provide three (3) different transmission regions, where the dimensions of the effectively formed three (3) different transmission regions (not shown) may be varied by shifting the position of the mask 7 of FIG. 7 relative to the position of the mask 8 of FIG. 8 as will be shortly explained.

In an exemplary embodiment and for convenient description, just two maximal transmission regions 50 of the plurality of maximal transmission regions are described. However the mask may have more.

Next, a photo-aligning method using the masks of FIG. 7 and FIG. 8 will be described with reference to FIG. 9A to FIG. 9E and FIG. 10A to FIG. 10E.

FIG. 9A to FIG. 9E are views showing a method for photo-aligning a lower alignment layer by using the photoalignment masks shown in FIG. 7 and FIG. 8 while shifting those masks. On the other hand, FIG. 10A to FIG. 10E are views showing a method for photo-aligning an upper alignment layer by again using the photoalignment masks shown in FIG. 7 and FIG. 8 but at different orientations. FIG. 11 is a view of a divided region according to an alignment direction of liquid crystal molecules after photo-aligning by using the photoalignment masks shown in FIGS. 7 and 8. It is to be understood that the masks shown in FIGS. 7 and 8 are not necessarily to scale and that different arrangements of dimensions of clear regions 50 may be employed to get results of the type about to be discussed for FIGS. 9A-9E and 10A-10E.

Figure 9A:
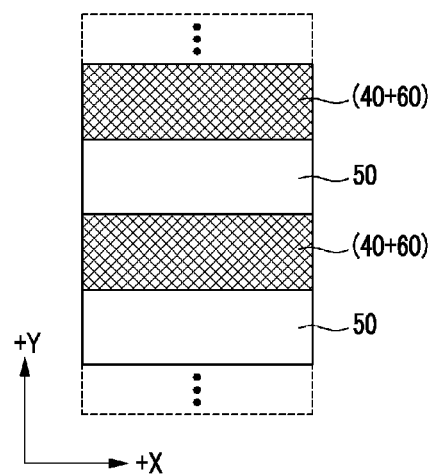
FIG. 9A to FIG. 9E are views showing a method for photo-aligning a lower alignment layer by using the photoalignment masks shown in FIG. 7 and FIG. 8.
Figure 9B:
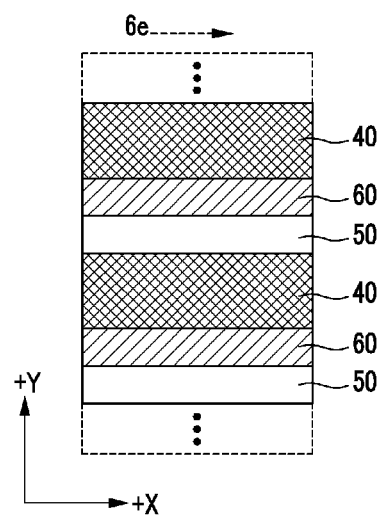

Firstly, as shown in FIG. 9A, the full transmission regions 50 of the mask of FIG. 7 and FIG. 8 are disposed to overlap each other so as to provide a maximally large clear window. On the other hand, regions 40 and 60 overlap each other whereby the full light blocking characteristics of region 40 then dominate. In one embodiment, the method of FIGS. 9A-9E is applied only to the lower alignment layer (not shown). Next, as shown in FIG. 9B, the mask of FIG. 8 is moved downward (in the −Y direction) such that the position of the maximal transmission region 50 of FIG. 7 partially overlaps that of the translucent region 60 of FIG. 8. Next, the linearly polarized ultraviolet rays 6e are irradiated in the +X direction under this configuration Thus, a first set of irradiation-treated regions are formed in sequence in areas not protected by blocking region 40.

Figure 9C:
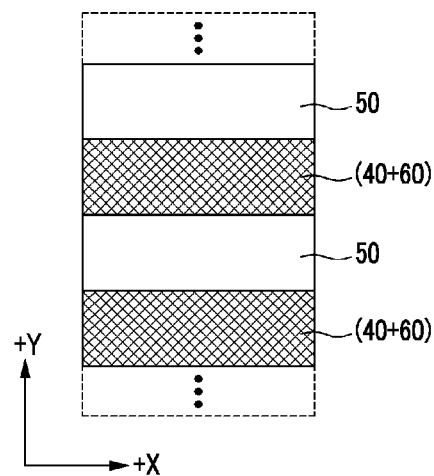

Next, as shown in FIG. 9C, the blocking region 40 combined with the translucent region 60, are aligned over the already irradiated regions thus masking those.

Figure 9D:
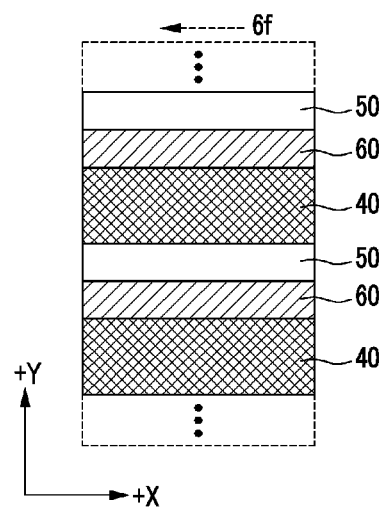

Next, as shown in FIG. 9D, the mask of FIG. 8 is moved upward (in the +Y direction) such that the maximal transmission region of FIG. 7 partially overlaps the translucent region of FIG. 8. Also, the linearly polarized ultraviolet rays 6f are irradiated with a −X tilt (from the right to left). Thus, the irradiated regions are formed according to the sequence and positioning of the maximal transmission region 50 and the translucent region 60 as shown in FIG. 9D.

Figure 9E:
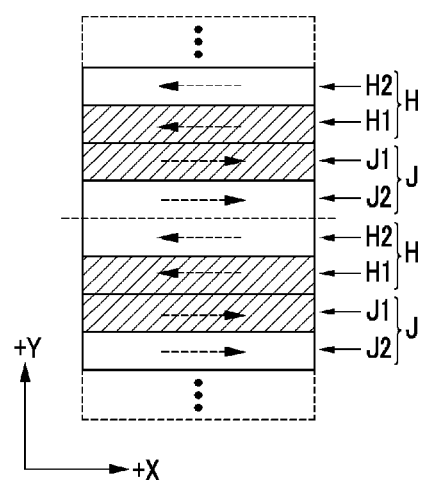

If the above procedure is repeated twice, but with different combinations of mask shifts, then, as shown in FIG. 9E, a fifth irradiation region H and a sixth irradiation region J are formed. Each irradiation region includes the fifth alignment polar angle regions H1 and J1, and the sixth alignment polar angle regions H2 and J2 having the different alignment polar angles.

Figure 10A:
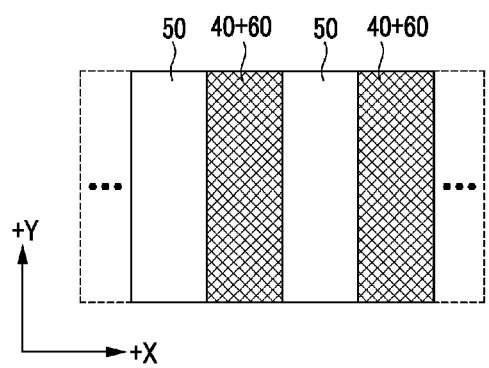
FIG. 10A to FIG. 10E are views showing a method for photo-aligning an upper alignment layer by using the photo-alignment masks shown in FIG. 7 and FIG. 8.
Figure 11:
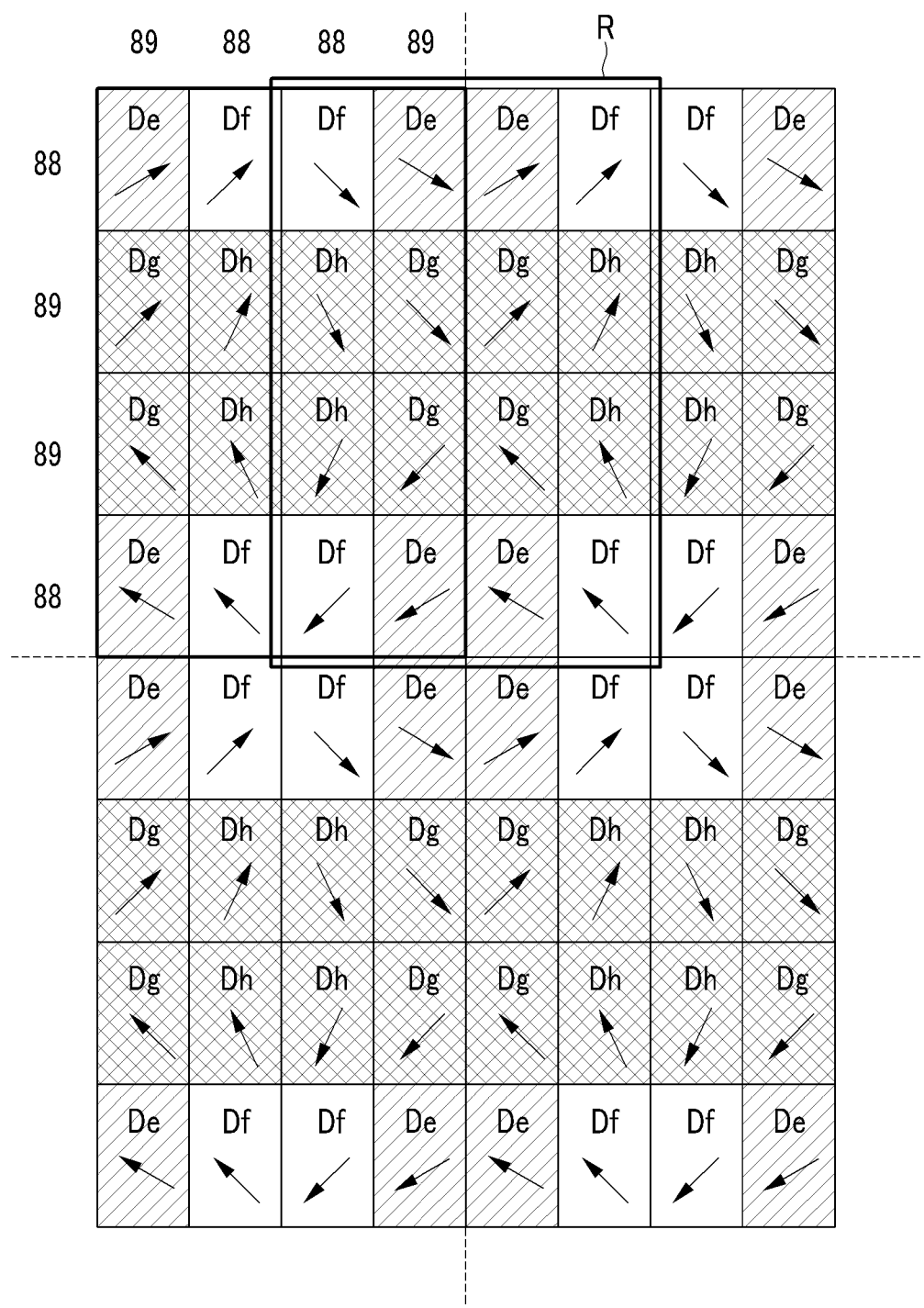
FIG. 11 is a view showing a divided region having a variety of alignment directions of liquid crystal molecules as a result of photo-aligning by using the photoalignment masks shown in FIGS. 7-8.

Next, as shown in FIG. 10A, the masks of FIG. 7 and FIG. 8 overlap each other for photo-treatment of the upper alignment layer (not shown). Here, the mask is disposed for the photoalignment to be perpendicular to the direction used for the lower alignment layer. That is, the positional shifts will now occur in the +X and −X directions.

Figure 10B:
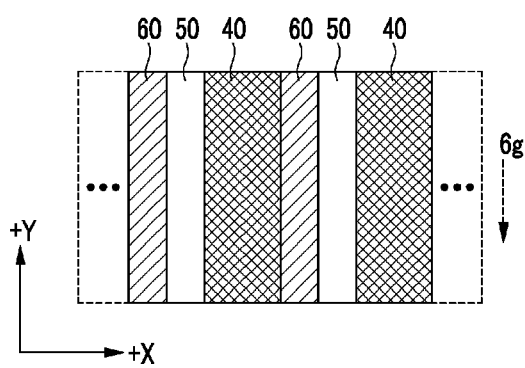

Next, as shown in FIG. 10B, the mask of FIG. 8 is moved to the right (in the +X direction) such that the maximal transmission region 50 of FIG. 7 partially overlaps the translucent region 60 of FIG. 8. Next, the linearly polarized ultraviolet rays 6g are irradiated with tilt in the −Y direction. Thus, first irradiated regions are formed in accordance with the sequence and positions of the exposed translucent regions 60 and the exposed maximal transmission regions 50.

Figure 10C:
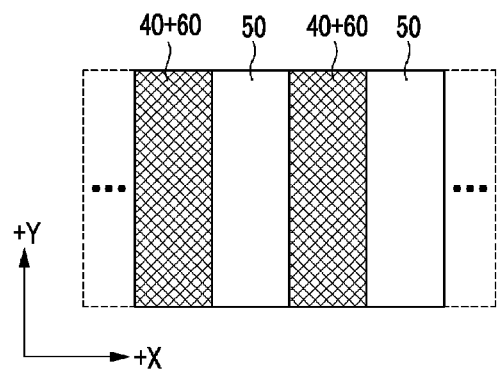

Next, as shown in FIG. 10C, the overlapping of the blocking regions 40 and the translucent regions 60 are moved to mask the already irradiated regions.

Figure 10D:
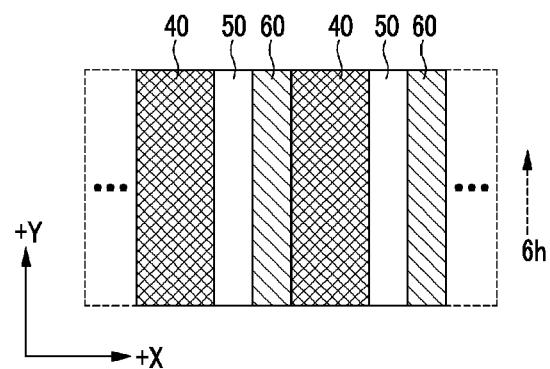

Next, as shown in FIG. 10D, the mask of FIG. 8 is moved to the left (in the −X direction) such that the maximal transmission region of FIG. 7 partially overlaps the translucent region of FIG. 8. Also, the linearly polarized ultraviolet rays 6h are irradiated with a +Y tilt (upwardly). Thus, the irradiated regions are formed in accordance with the sequence and positions of the exposed maximal transmission regions 50 and the exposed translucent regions 60.

Figure 10E:
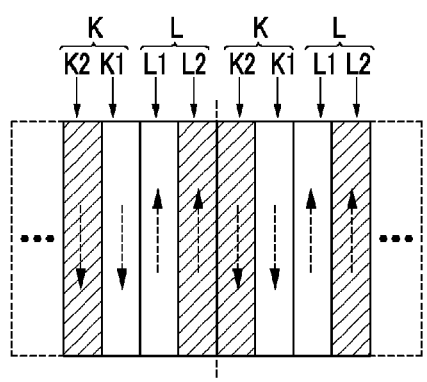

Accordingly, as shown in FIG. 10E, a seventh irradiation region K and an eighth irradiation region L where the linearly polarized ultraviolet rays are irradiated in the different directions are formed. Each irradiation region includes the seventh alignment polar angle regions K1 and L1 and the eighth alignment polar angle regions K2 and L2 having the different alignment polar angles.

Next, if the upper and lower mother substrates are assembled as shown in FIG. 11, the liquid crystal molecules may be aligned in the various combinations of directions De, Df, Dg, and Dh.

Referring to FIG. 11, the alignment polar angles of the upper and lower substrates are different in the sub-regions De and Dg, and the alignment polar angles of the upper and lower substrates are equal to each other in the sub-regions Df and Dh. Accordingly, the alignment azimuth angle is 45° in the sub-regions Df and Dh, and the azimuth angle of the sub-regions Dg and Dh is less than or larger than 45°.

Next, a liquid crystal display applied with the above-described photoalignment will be described in detail. The photoalignment may be applied to liquid crystal displays having various arrangements shown in FIG. 12 to FIG. 23.

Figure 12:
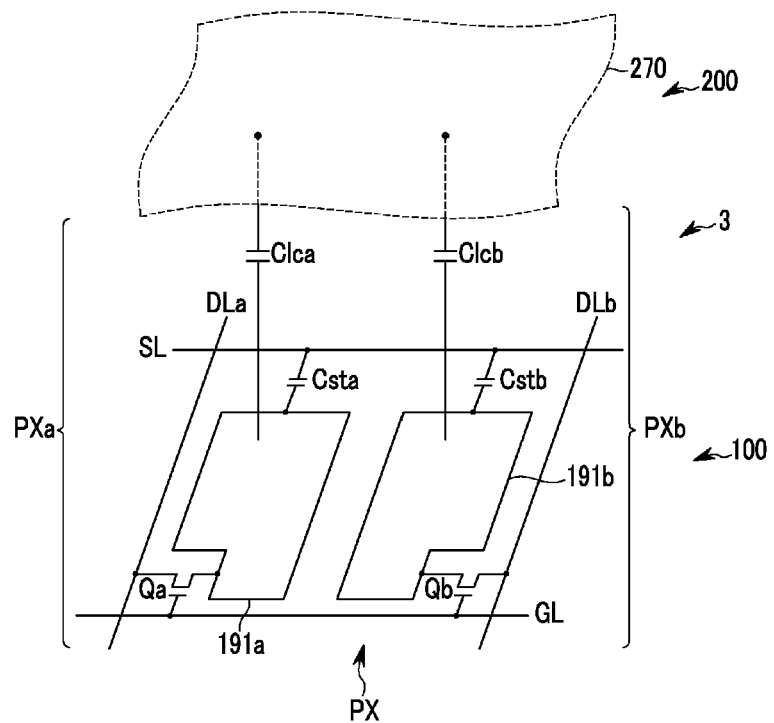
FIG. 12 is an equivalent circuit diagram for one pixel unit of a liquid crystal display according to an exemplary embodiment.

FIG. 12 is an equivalent circuit diagram of one pixel unit of a liquid crystal display according to an exemplary embodiment of the present disclosure where the pixel unit includes plural pixel-electrodes.

Referring to FIG. 12, a liquid crystal display according to the exemplary embodiment includes signal lines including a plurality of gate lines GL, a plurality of pairs of data lines DLa and DLb, a plurality of storage electrode lines SL, and a plurality of subpixel units PXa, PXb, connected to the signal lines. In the point of view of an overall structure, the liquid crystal display (LCD) device includes a lower panel 100 and an upper panel 200 facing each other, and a liquid crystal layer 3 interposed therebetween.

More specifically, each pixel unit PX includes a pair of subpixel units PXa and PXb. Each subpixel unit PXa/PXb includes a respective switching element Qa/Qb, a corresponding liquid crystal capacitor Clca/Clcb, and a respective storage capacitor Csta/Cstb.

In one embodiment, each switching element Qa/Qb is a three-terminal element such as a thin film transistor (TFT) integrally provided on the lower panel 100, where the element has a control terminal connected to the gate line GL, an input terminal connected to the respective data line DLa/DLb, and an output terminal connected to the respective liquid crystal capacitor Clca/Clcb and the storage capacitor Csta/Cstb.

The respective liquid crystal capacitor Clca/Clcb uses corresponding subpixel electrode 191a or 191b, and a portion of common electrode 270 as its two plates. The liquid crystal layer 3 between the electrodes 191a/191b and 270 functions as a dielectric material for the liquid crystal capacitors Clca/Clcb.

The storage capacitor Csta/Cstb serving as an assistant to the liquid crystal capacitor Clca/Clcb is formed as a storage electrode line SL provided on the lower display panel 100 and a subpixel electrode 191a/191b overlapping with an insulator interposed therebetween, and a predetermined voltage such as the common voltage Vcom is applied to the storage electrode line SL.

It has been determined that a wider practical viewing angle can be obtained if a predetermined difference is generated between voltages charged to the two liquid crystal capacitors Clca and Clcb. For example, if the data voltage applied to the liquid crystal capacitor Clca is less or more than the data voltage applied to the liquid crystal capacitor Clcb then the angle may be increased. Therefore, when the voltages of the first and second liquid crystal capacitors Clca and Clcb are appropriately adjusted to be different from one another, it is possible to make an image viewed from the side be as similar as possible to an image viewed from the front, and as a result it is possible to improve the side visibility.

Next, a liquid crystal display according to an exemplary embodiment of the present invention will be described in detail with reference to FIG. 13 and FIG. 14.

Figure 13:
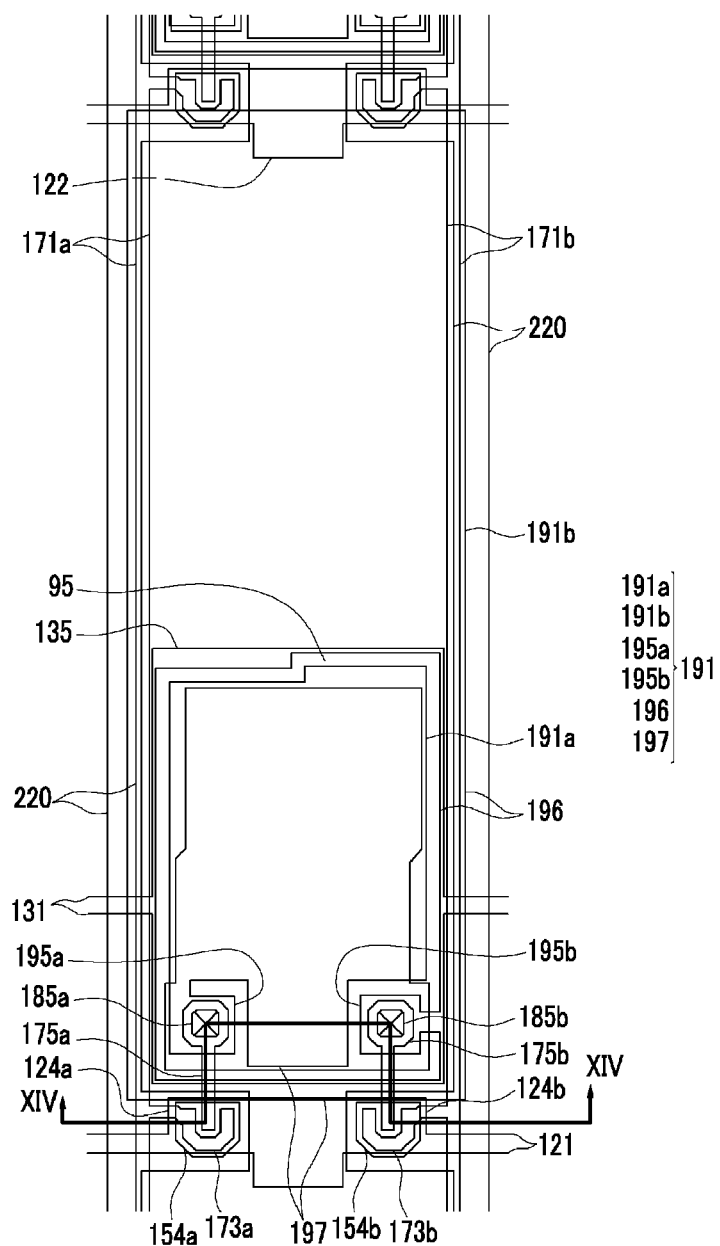
FIG. 13 is a layout view of a liquid crystal display according to an exemplary embodiment.

FIG. 13 is a layout view of a pixel unit portion of a liquid crystal display according to an exemplary embodiment. FIG. 14 is a cross-sectional view of the liquid crystal display shown in FIG. 13 taken along the line XIV-XIV.

Figure 14:
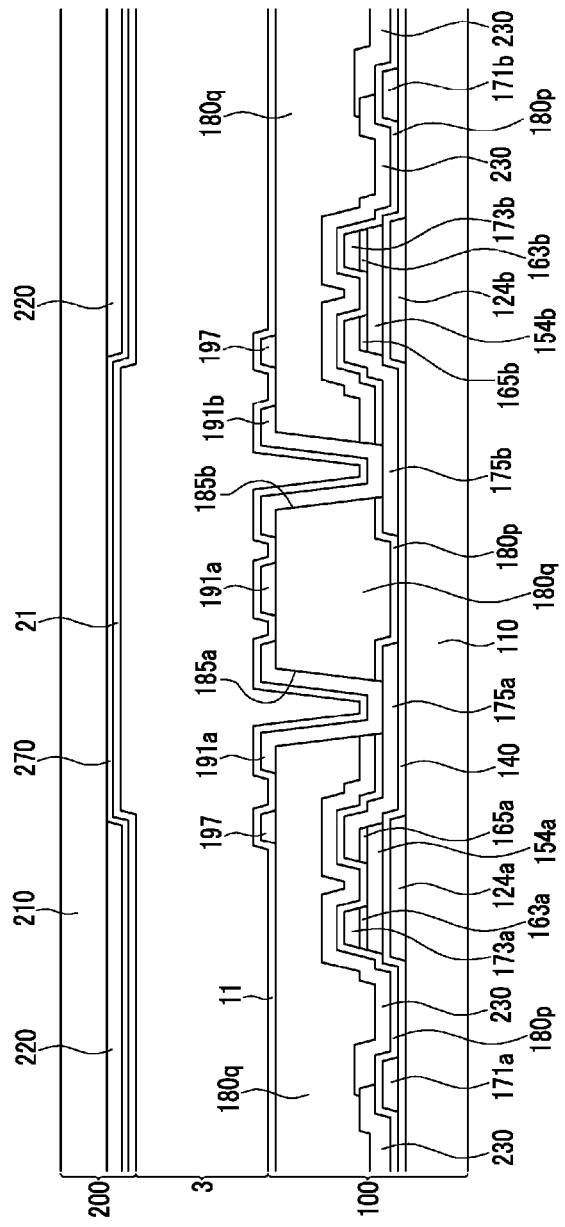
FIG. 14 is a cross-sectional view taken along the line XIV-XIV of FIG. 13.

Referring to FIG. 13 and FIG. 14, a liquid crystal display according to an exemplary embodiment includes the lower panel 100 and the upper panel 200 facing each other, and the liquid crystal layer 3 interposed between the two display panels 100 and 200.

Firstly, the lower panel 100 will be described.

A plurality of gate lines 121 and a plurality of storage electrode lines 131 and 135 are formed on an insulating substrate 110.

The gate lines 121 transmit gate signals and substantially extend in the transverse direction. Each gate line 121 includes a plurality of first and second gate electrodes 124a and 124b protruding upward, and a protrusion 122 protruding downward in FIG. 13.

The storage electrode lines 131 and 135 include a stem 131 extending substantially parallel to the gate lines 121 and a storage electrode 135 with a ring shape. The width of a portion of the storage electrode 135 is expanded, and the shapes and arrangements of the storage electrode lines 131 and 135 may be modified in various forms.

A gate insulating layer 140 is formed on the gate lines 121 and on the storage electrode lines 131 and 135. A plurality of semiconductive regions 154a and 154b each preferably made of amorphous or crystallized silicon are formed on the gate insulating layer 140.

A plurality of pairs of ohmic contacts 163a, 163b, 165a, and 165b are formed on the first semiconductor 154b, and the ohmic contacts 163a, 163b, 165a, and 165b may be formed of a material such as n+ hydrogenated amorphous silicon in which an n-type impurity is doped with a high concentration, or of silicide.

A plurality of pairs of data lines 171a and 171b and a plurality of pairs of first and second drain electrodes 175a and 175b are formed on the ohmic contacts 163a, 163b, 165a, and 165b, and on the gate insulating layer 140.

The data lines 171a and 171b transmit data signals and extend substantially in the longitudinal direction, and cross the gate lines 121 and the stems 131 of the storage electrode lines. The data lines 171a/171b include a plurality of first/second source electrodes 173a/173b extending toward the first/second gate electrodes 124a/124b and are curved with a "U" shape, and the first/second source electrodes 173a/173b are opposite to the first/second drain electrodes 175a/175b with respect to the first/second gate electrodes 124a/124b.

Each of the first drain electrode 175a and the second drain electrode 175b starts from one end enclosed by the first source electrode 173a and the second source electrode 173b and is extended upward in FIG. 13, and other end thereof may have a wide area for connection to another layer.

However, the top-view shapes and arrangement of the first and second drain electrodes 175a and 175b and the data lines 171a and 171b may be modified in various forms.

The first/second gate electrodes 124a/124b, the first/second source electrodes 173a/173b, and the first/second drain electrodes 175a/175b respectively form the first/second thin film transistors (TFTs) Qa/Qb along with the first/second semiconductors 154a/154b, and the channels of the first/second thin film transistors Qa/Qb are respectively formed on the first/second semiconductors 154a/154b between the first/second source electrodes 173a/173b and the first/second drain electrodes 175a/175b.

The ohmic contacts 163a, 163b, 165a, and 165b are interposed only between the underlying semiconductor islands 154a and 154b, and the overlying data lines 171a and 171b and drain electrodes 175a and 175b, and reduce contact resistance between them. The semiconductors 154a and 154b have a channel portion that is not covered by and is between the source electrodes 173a and 173b and the drain electrodes 175a and 175b.

A lower passivation layer 180p preferably made of a silicon nitride or a silicon oxide is formed on the data lines 171a and 171b, the drain electrodes 175a and 175b, and the exposed portions of the semiconductors 154a and 154b.

A color filter 230 is formed on the lower passivation layer 180p, and the color filter 230 is extended according to the length direction of the pixel. The color filter 230 may be formed by using a photolithography process or an inkjet printing method, and when using the Inkjet printing method, a partition enclosing the color filter may be further formed.

An upper passivation and planarization layer 180q is formed on the color filter 230. The upper passivation layer 180q may be made of an inorganic insulator or an organic insulator, and may provide a flat surface. Examples of the inorganic insulator include silicon nitride and silicon oxide. The organic insulator may be formed of a photosensitive material (PR), and the preferable dielectric constant thereof is lower than about 4.0. A plurality of pixel electrodes 191 are formed on the upper passivation layer 180q.

Each pixel electrode 191 includes the first and second subpixel electrodes 191a and 191b that are separated from each other with a gap 95 therebetween. The gap 95 overlaps the storage electrode 135 thereby preventing light leakage due to the gap 95. The gap 95 may be curved according to the shape of the texture, and the two subpixel electrodes 191a and 191b form a shape of which the upper and the lower portions thereof are engaged with each other via the gap 95 by the curved portion.

The first subpixel electrode 191a has a substantially quadrangular shape, and the lower corner is concave according to the boundary of the first drain electrode 175a and the second drain electrode 175b.

The first subpixel electrode 191a includes a protrusion 195a protruded toward the first drain electrode 175a, and the protrusion 195a is physically and electrically connected to the first drain electrode 175a through a contact hole 185a.

Also, the second subpixel electrode 191b includes a pair of branches 196 extending according to the data lines 171a and 171b. The branches 196 are disposed between the first subpixel electrode 191a and the data lines 171a and 171b, and are connected to a connection 197 at the lower portion of the first subpixel electrode 191a. Accordingly, the first subpixel electrode 191b is enclosed by the second subpixel electrode 191b, the branches 196, and the connection 197. One branch of two branches of the second subpixel electrode 191b includes a protrusion 195b, and the protrusion 195b is physically and electrically connected to the second drain electrode 175b through the contact hole (via) 185b.

The area occupied by the second subpixel electrode 191b may be larger than the area occupied by the first subpixel electrode 191a in the whole of the surface area of the pixel electrode 191, and the area of the second subpixel electrode 191b may be larger than about 1.0 to 2.2 times the area of the first subpixel electrode 191a.

The upper boundary of the second subpixel electrode 191b overlaps the protrusion 122 of the previous gate line, thereby forming the storage capacitance.

A lower alignment layer (LAL) 11 is formed on the pixel electrode 191.

Next, the upper panel 200 will be described.

Referring to the upper panel 200, a light blocking member 220 preventing light leakage is formed on a transparent insulation substrate 210 (e.g., glass). The light blocking member 220 is formed according to the data lines 171a and 171b, and includes a portion corresponding to the thin film transistor. In an exemplary embodiment, the light blocking member is not formed on a portion corresponding to the gate line 121, however a light blocking member corresponding to the gate line 121 may be further formed.

In an exemplary embodiment, the light blocking member is formed in the upper substrate; however it may be alternatively formed in the lower substrate.

A transparent common electrode 270 (e.g., ITO or IZO) is formed in the whole surface on the light blocking member 220, and an alignment layer 21 is formed on the common electrode 270.

In the above-described liquid crystal display according to an exemplary embodiment, the upper and lower alignment layers are aligned by the above-described photoalignment methods, and will be further described with reference to FIG. 15.

FIG. 15, FIG. 16, FIG. 24, and FIG. 25 are views showing the pixel electrode and the sub-region of FIG. 13 to explain photoalignment of a liquid crystal display according to an exemplary embodiment.

Figure 15:
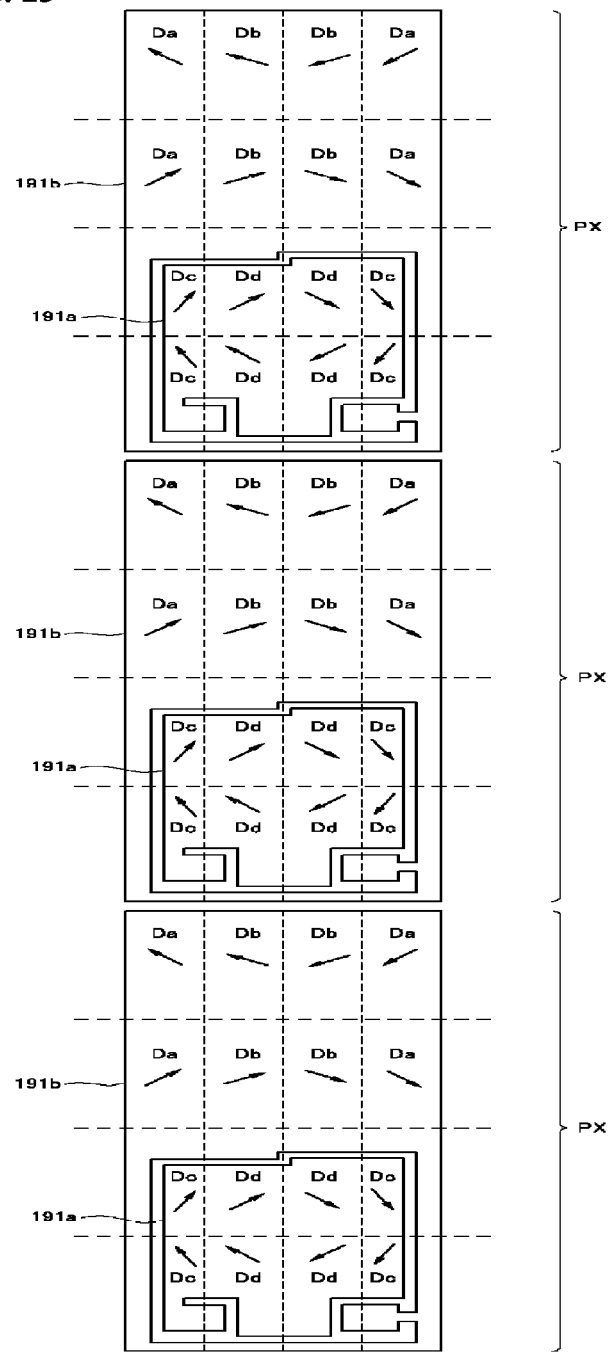
FIG. 15 and FIG. 16 are views showing the pixel electrode and the sub-region of FIG. 13 to explain photoalignment of a liquid crystal display according to an exemplary embodiment.

FIG. 15 will mainly describe a pixel aligned by the photoalignment method shown in FIG. 3 and FIG. 4. Here, for convenience of description, the pixel electrodes of the respective pixel units are shown.

As shown in FIG. 15, a plurality of pixel units Px are provided, each including respective one s of the first subpixel electrode 191a and the second subpixel electrode 191b. Also, each pixel unit includes a plurality of sub-regions Da-Dd that are aligned in various directions by a photoalignment method such as the one shown in FIG. 3 and FIG. 4.

The sub-regions Da and Dd having the azimuth angle of 45° among the plurality of sub-regions. And the sub-regions Da are formed on the edge of the second subpixel electrode 191b and the sub-regions Dd are formed on the center of the first subpixel electrode 191a. The sub-regions Db and Dc having the azimuth angle of less or more than (significantly different than) 45°. And the sub-region Db are formed on the center of the second subpixel electrode 191b and the sub-region Dc formed on the edge of the first subpixel electrode 191a.

Figure 16:
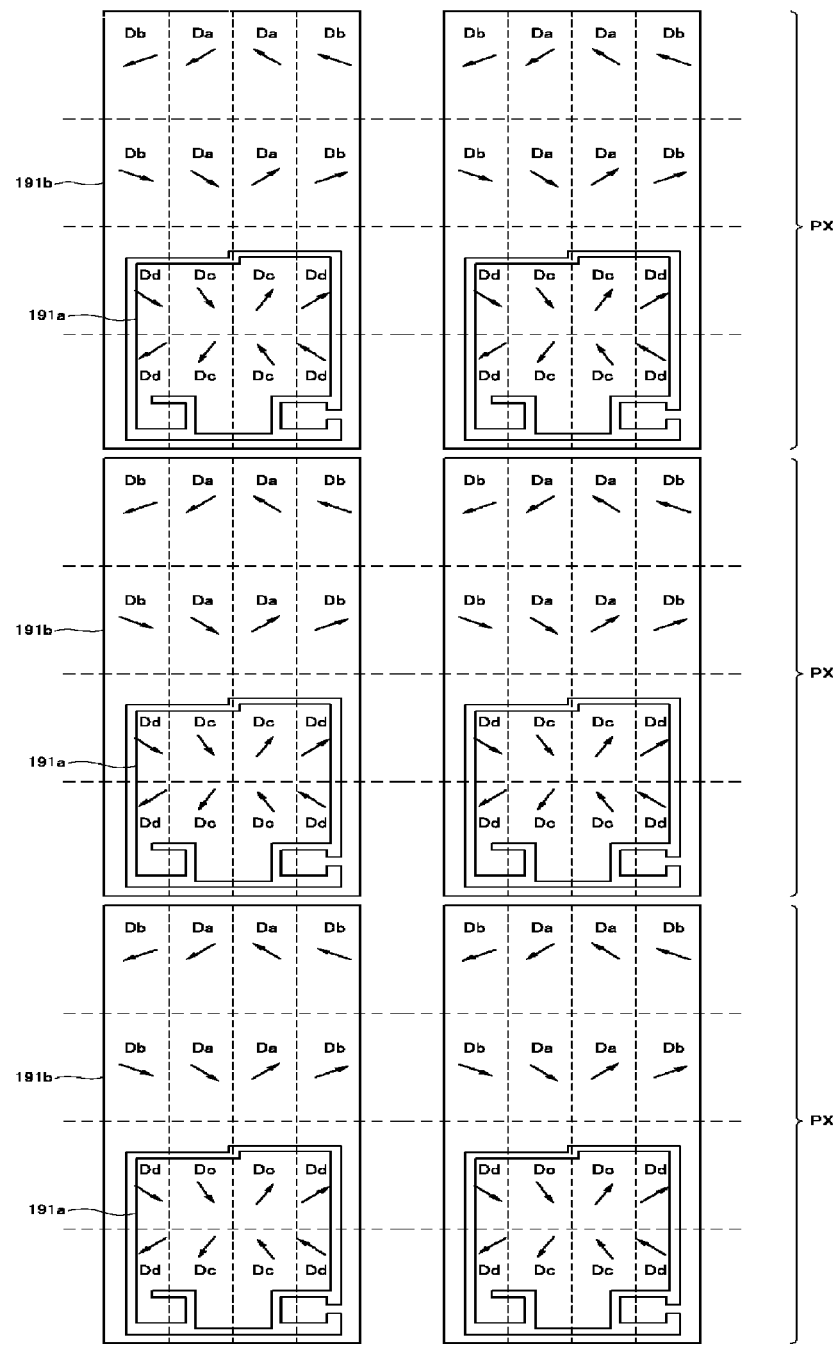

However, as shown in FIG. 16, the sub-regions Da may be formed on the center of the second subpixel electrode 191b, the sub-regions Dd may be formed on the edge of the first subpixel electrode 191a, the sub-regions Db may be formed on the edge of the second subpixel electrode 191b and Dc may be formed on the center of the first subpixel electrode 191a. This may be obtained by changing the exposure positions of the corresponding mask used for FIG. 15 to two neighboring pixels, differently from FIG. 15.

In the liquid crystal display, the transmittance is maximum when the alignment azimuth angle is 45° such that the sub-regions Da and Dd are formed in FIG. 16. So area of the Da and Dd are larger than area of the Db and Dc.

Figure 24:
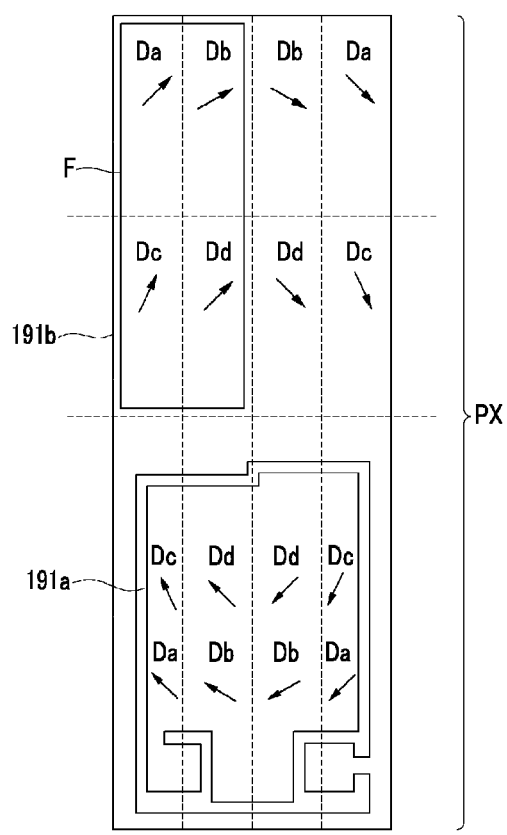
FIG. 24 and FIG. 25 are views showing pixel electrodes and sub-regions of the embodiment of FIG. 13.
Figure 25:
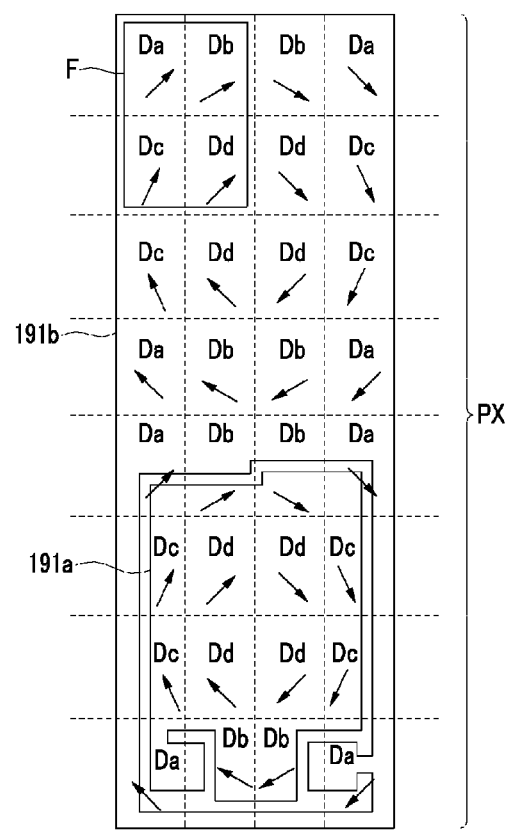

When using a mask such as 5 of FIG. 1 and according to the present disclosure, then as shown in FIGS. 24 and 25, a pixel 191 having a circular arrangement.

In detail, in FIG. 24, a circular arrangement is formed by two sub pixels of a first sub pixel electrode 191a and a second sub pixel electrode 191b.

Further, in FIG. 25, a circular arrangement is formed by each of the first sub pixel electrode 191a and the second sub pixel electrode 191b. In FIGS. 24 and 25, when Da to Dd are called one group F, azimuth angles of arrangements may be different from each other.

Figure 17:
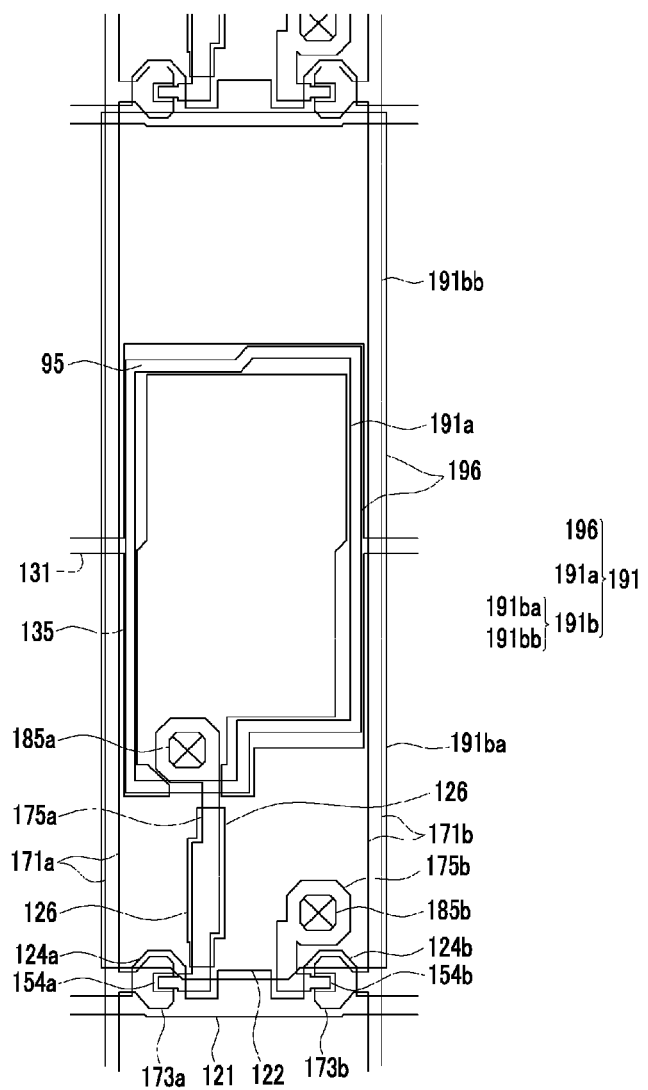
FIG. 17 is a layout view of a thin film transistor array panel for a liquid crystal display according to an exemplary embodiment.

FIG. 17 shows a layout view of a thin film transistor array panel for a liquid crystal display according to another exemplary embodiment.

The layered structure is almost the same as the layered structure of the liquid crystal display shown in FIG. 13 and FIG. 14, such that only different portions will be described.

Referring to FIG. 17, a gate line 121 including the first gate electrode 124a, the second gate electrode 124b, and the protrusion 122, and the storage electrode line 131 including the storage electrode 135, are formed on the substrate.

However, the protrusion 122 of the gate line 121 is protruded upward thereby overlapping the pixel electrode 191, differently from the exemplary embodiment of FIG. 13. Also, the gate line further includes a conductor 126 extending in the longitudinal direction.

The storage electrodes 135 are not connected with the ring shape; however the lower portions thereof are separated from each other, differently from the exemplary embodiment of FIG. 13.

A gate insulating layer (not shown) is formed on the gate line 121 and the storage electrode line 131, and the semiconductors 154a and 154b and the ohmic contact (not shown) are formed on the gate insulating layer.

The first data line 171a and the second data line 171b intersecting the gate line 121 are formed on the ohmic contact. The first data line 171a and the second data line 171b respectively include the first source electrode 173a and the second source electrode 173b with a "C" shape.

One end of each of the first drain electrode 175a and the second drain electrode 175b is enclosed by the first source electrode 173a and the second source electrode 173b, and the other ends thereof are extended for contact with another layer. The first drain electrode 175a overlaps the conductor 126.

The first data line 171a, the second data line 171b, the first drain electrode 175a, and the second drain electrode 175b have the same plane shape as the ohmic contact, and the ohmic contact has the same plane shape as the semiconductors 154a and 154b except for the exposed portion between the source electrodes 173a and 173b and the drain electrodes 175a and 175b. This may be obtained by formed the data line, the ohmic contact, and the semiconductor using a photosensitive film having different thicknesses. However, as shown in FIG. 13, each layer may be formed by using different photosensitive films.

A passivation layer (not shown) is formed on the first data line 171a, the second data line 171b, the first drain electrode 175a, and the second drain electrode 175b.

A pixel electrode 191 is formed on the passivation layer, and the pixel electrode 191 includes the first subpixel electrode 191a and the second subpixel electrode 191b (where 191b is formed of split portions 191ba and 191bb) that are separated from each other via the gap 95 therebetween.

However, differently from the exemplary embodiment of FIG. 13 and as indicated above, the second subpixel electrode 191b includes an upper second subpixel electrode 191bb and a lower second subpixel electrode 191ba that are respectively positioned on the upper and lower portions with respect to the centrally positioned first subpixel electrode 191a, and the first subpixel electrode 191a is enclosed by the upper second subpixel electrode 191bb and the lower second subpixel electrode 191ba and the branches 196.

The first drain electrode 175a transverses the lower second subpixel electrode 191ba, passes the separated portions of the storage electrode 135, and is connected to the first subpixel electrode 191a through the contact hole 185a, and the second drain electrode 175b is connected to the lower second subpixel electrode 191ba through a contact hole 185b.

A liquid crystal display including the thin film transistor array panel shown in FIG. 17 may be aligned by the above-described photoalignment methods or equivalents, and will be described with reference to FIG. 18.

Figure 18:
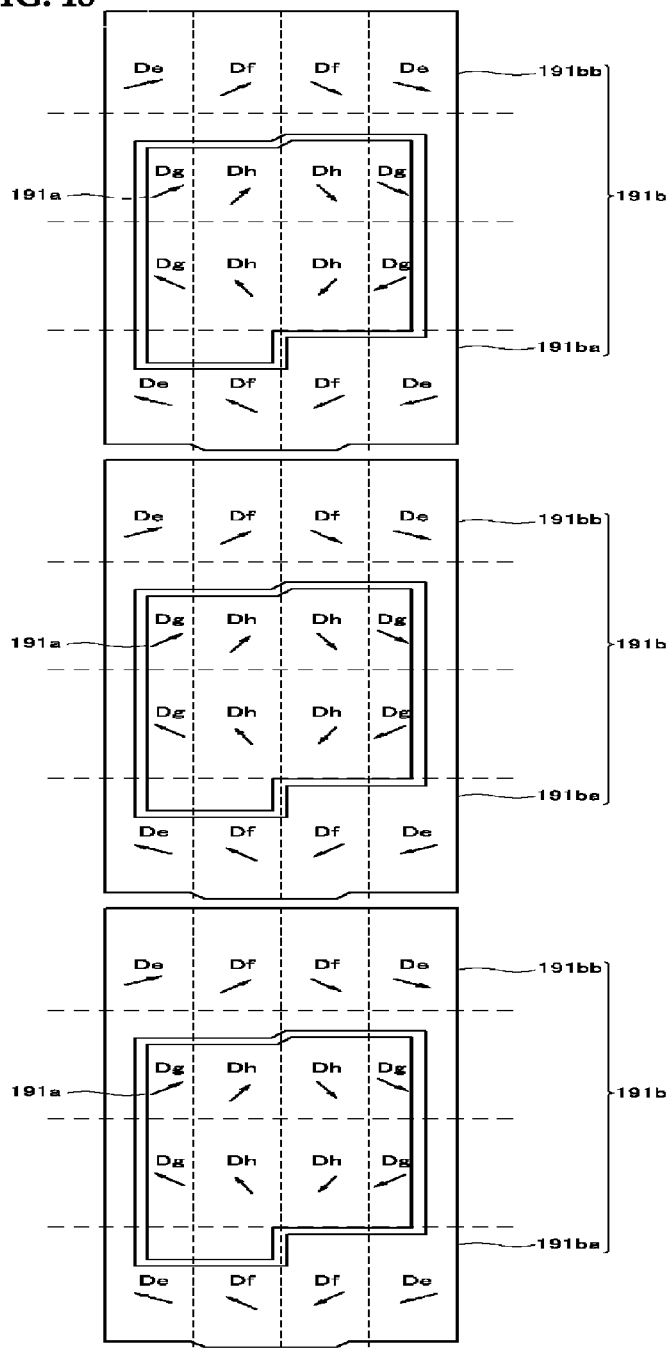
FIG. 18 is a view showing the pixel electrode and the sub-region of FIG. 17 to explain photoalignment of a liquid crystal display according to an exemplary embodiment.

FIG. 18 is a view showing the pixel electrode and the sub-region of FIG. 17 to explain photoalignment of a liquid crystal display according to the corresponding exemplary embodiment.

FIG. 18 will mainly describe a pixel aligned by the photoalignment method shown in FIG. 9A to FIG. 10E. Here, for convenience of description, only the pixel electrode PX of each pixel unit is shown.

As shown in FIG. 18, a plurality of pixel units Px respectively include the first subpixel electrode 191a and the second subpixel electrode 191ba/bb. Also, each pixel includes a plurality of sub-regions De-Dh that are aligned in various directions by the photoalignment method shown in FIG. 9A to FIG. 11E.

The sub-regions Df and Dg having the azimuth angle of 45° among the plurality of sub-regions. And the sub-regions Df are formed on the center of the second subpixel electrode 191b and the sub-regions Dg are formed on the edge of the first subpixel electrode 191a.

However, corresponding each pixel to a portion R of FIG. 11, the sub-regions Df may be formed on the edge of the first subpixel electrode and the Dg may be formed on the center of the second subpixel electrode.

In the above-described exemplary embodiment, the first subpixel electrode and the second subpixel electrode are connected to the different data lines thereby being applied with the different voltages, however in a following exemplary embodiment, the first subpixel electrode and the second subpixel electrode are connected to one data line thereby being applied with different voltages.

Figure 19:
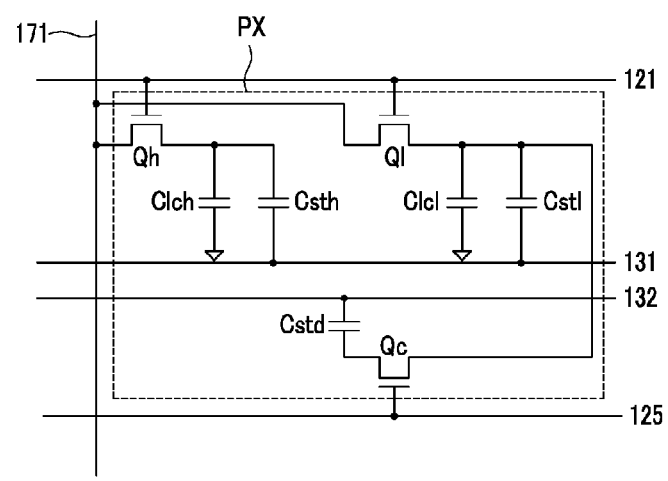
FIG. 19 is an equivalent circuit diagram for one pixel of a liquid crystal display according to an exemplary embodiment.

FIG. 19 is an equivalent circuit diagram of one pixel unit PX of a liquid crystal display according to an exemplary embodiment.

Referring to FIG. 19, a liquid crystal display according to an exemplary embodiment includes signal lines including a main gate line 121, a main storage electrode line 131, an ancillary storage electrode line 132 for a step-down capacitor Cstd, a step-down gate line 125, and a data line 171, and a common electrode portion capacitively coupled thereto.

The pixel unit PX includes the first switching element Qh, the second switching element Ql, the third switching element Qc, the first liquid crystal capacitor Clch, the second liquid crystal capacitor Clcl, the first storage capacitor Csth, the second storage capacitor Cstl, and a step-down capacitor Cstd. Here, the first switching element Qh corresponds to first thin film transistor Qa, the second switching element Qbl corresponds to second thin film transistor Qb, and the third switching element Qc (formed as a third thin film transistor) are respectively denoted by same reference numerals as their corresponding capacitors.

The first and second thin film transistors Qh and Ql are respectively connected to the gate line 121 and the data line 171, and the third thin film transistor Qc is connected to the step-down gate line 125.

The first and second thin film transistors Qh and QL as three terminal elements provided in the lower panel 100 have a control terminal connected to the gate line 121, an input terminal connected to the data line 171, and an output terminal connected to the first and second liquid crystal capacitors Clch and Clcl, and the first and second storage capacitors Csth and Cstl.

The third thin film transistor Qc as a three terminal element such as the thin film transistor provided in the lower panel 100 has a control terminal connected to the step-down gate line 125, an input terminal connected to the second liquid crystal capacitor Clcl, and an output terminal connected to the step-down capacitor Cstd.

The first and second liquid crystal capacitors Clch and Clcl are formed by overlapping the first and second subpixel electrodes 191a and 191b connected to the first and second switching elements Qa and Qb and the common electrode 270 of the upper panel 200 with each other. The first and second storage capacitors Csta and Csta are formed by overlapping the storage electrode line 131 as well as the storage electrode 135 and the first and second subpixel electrodes 191a and 191b.

The step-down capacitor Cstd is connected to the output terminal of the third thin film transistor Qc and the storage electrode line 132, and the storage electrode line 132 provided in the lower panel 100 and the output terminal of the third thin film transistor Qc overlap each other via the insulator.

Firstly, if the gate line 121 is applied with the gate-on voltage Von, the first and second thin film transistors Qh and Ql that are connected thereto are turned on.

Accordingly, the data voltage applied to the data line 171 is equally applied to the first and second subpixel electrodes 191a and 191b through the turned-on first and second switching elements Qa and Qb. The first and second liquid crystal capacitors Clca and Clcb are both charged by a difference between the common voltage Vcom of the common electrode 270 and the voltage of the first and second subpixel electrodes 191a and 191b such that the charging voltage of the first liquid crystal capacitor Clca is the same as the charging voltage of the second liquid crystal capacitor Clca. Here, the step-down gate line 125 is applied with the gate-off voltage Voff.

Next, if the gate line 121 is applied with the gate-off voltage Voff, and simultaneously the step-down gate line 123 is applied with the gate-on voltage Von, the first and second switching elements Qa and Qb connected to the gate line 121 are turned off, while the third switching element Qc is now turned on. Accordingly, the charges of the second subpixel electrode 191b connected to the output terminal of the second switching element Ql partially flows into the step-down capacitor Cstd such that the voltage of the second liquid crystal capacitor Clcl is decreased while the voltage in Clch remains substantially unchanged. Thus different voltages are ultimately applied to the subpixel electrodes (191a, 191b).

In an example of the case that the liquid crystal display according to the present exemplary embodiment is driven by frame inversion, the data line 171 has a positive data voltage with respect to the common voltage Vcom in the present frame, and negative charges are gathered in the step-down capacitor Cstd after the previous frame is finished. In the present frame, if the third switching element Qc is turned on, the positive charges of the second subpixel electrode 191b flow in the step-down capacitor Cstd through the third switching element Qc such that the positive charges are gathered in the step-down capacitor Cstd and the voltage of the second liquid crystal capacitor Clcb is decreased. Next, in the next frame, the third switching element Qc is turned on in the state that the negative charges are charged in the second subpixel electrode 191b such that the negative charges of the second subpixel electrode 191b flow in the step-down capacitor Cstd such that the negative charges are gathered in the step-down capacitor Cstd and the voltage of the second liquid crystal capacitor Clcb is decreased.

As described above, according to the present exemplary embodiment, the charging voltage of the second liquid crystal capacitor Clcl is lower in absolute value than the charging voltage of the first liquid crystal capacitor Clch regardless of the polarity of the data voltage. Accordingly, the charging voltages of the first and second liquid crystal capacitors Clch and Clcl are different such that the lateral view of the liquid crystal display may be improved.

A thin film transistor array panel for a liquid crystal display including the above described circuit will now be described with reference to FIG. 20 to FIG. 23.

Figure 20:
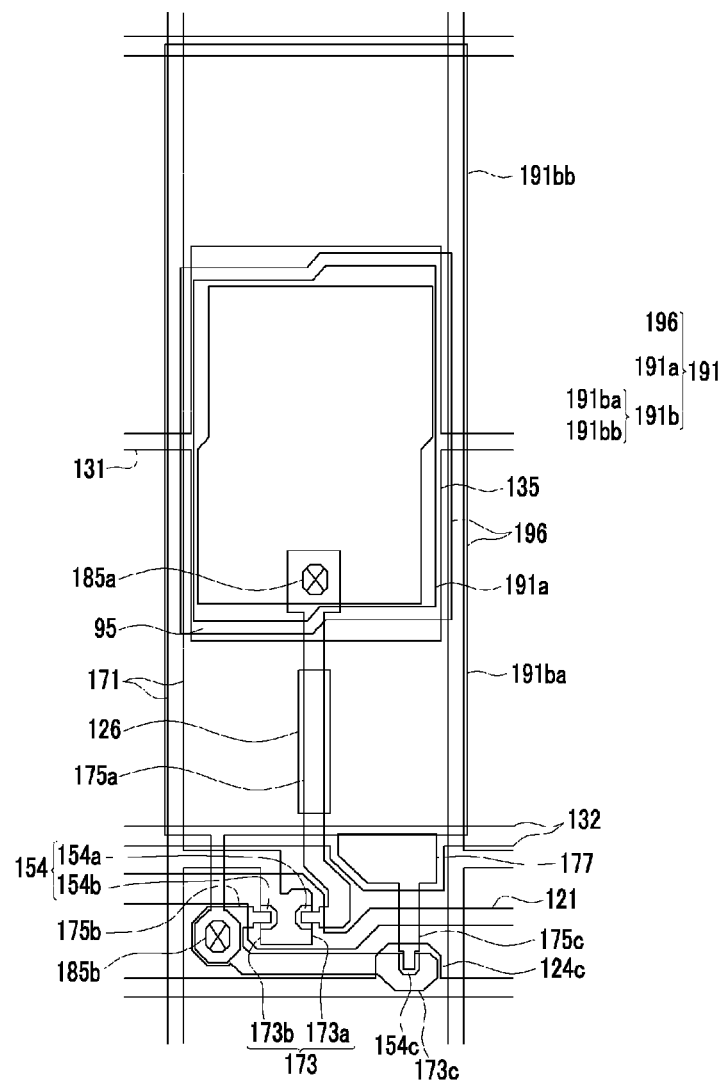
FIG. 20 is a view of a thin film transistor array panel for a liquid crystal display according to an exemplary embodiment.

FIG. 20 is a view showing a thin film transistor array panel for a liquid crystal display according to yet another exemplary embodiment in accordance with the disclosure. Most of the layered structure of FIG. 20 is substantially the same as the layered structure of FIG. 13 and FIG. 14 such that only different portions will be described in detail.

Referring to FIG. 20, a plurality of gate lines 121, a plurality of step-down gate lines 125, a plurality of storage electrode lines 131, and a step-down capacitor storage electrode line 132 are formed on the substrate.

The gate line 121 and the step-down gate line 125 are extended in the transverse direction, and transmit the gate signal. Each gate line 121 includes a gate electrode 124 having an expanded width, and each step-down gate line 125 includes a third gate electrode 124c protruding upward. The first gate electrode and the second gate electrode are connected into one, thereby forming the gate electrode 124, and may be separated like the exemplary embodiment of FIG. 13.

The storage electrode lines 125 and the step-down capacitor storage electrode line 132 are mainly extended in the horizontal direction, and the storage electrode line 131 includes a storage electrode 135 with a ring shape. The step-down capacitor storage electrode line 132 forming the step-down capacitor may be separated from the storage electrode line 131; however they are applied with the same common voltage thereby being connected to each other (not shown).

A gate insulating layer (not shown) is formed on the gate line 121, the step-down gate line 125, the storage electrode line 131, and the step-down capacitor storage electrode line 132.

A semiconductor 154 is formed on the gate insulating layer. For convenience of description, a portion overlapping the gate electrode 124 among the semiconductor 154 is referred to as a first semiconductor 154a, and the remaining portion is referred to as a second semiconductor 154b. Also, a portion overlapping the third gate electrode 124c is referred to as a third semiconductor 154c.

A plurality of ohmic contact stripes and ohmic contact islands (not shown) are formed on the semiconductor 154.

A plurality of data lines 171, a plurality of first drain electrodes 175a, a plurality of second drain electrodes 175b, and a plurality of third drain electrodes 175c are formed on the ohmic contact stripes and the ohmic contact islands.

The data lines 171 transmit data signals and extend in the longitudinal direction, thereby intersecting the gate lines 121 and the step-down gate lines 125. Each data line 171 includes a source electrode 173 overlapping the gate electrode 124. The source electrode 173 includes a first source electrode 173a enclosing the first drain electrode 175a and a second source electrode 173b enclosing the second drain electrode 175b, that have an inlet in the opposite direction thereby forming a substantially "X" shape.

One end of each of the first drain electrode 175a and the second drain electrode 175b is respectively enclosed by the source electrodes 173a and 173b. The other end of the first drain electrode 175a has a wide width for connection with a different layer. The second drain electrode 175b has a portion including the wide width for the connection with the different layer, and the other end of the second drain electrode 175b is connected to a third source electrode 173c of the third switching element Qc.

One end of the third drain electrode 175c is enclosed by the third source electrode 173c with the "U" shape, and the other end 177 has the wide width, and overlaps the step-down capacitor storage electrode line 132 thereby forming the step-down capacitor Cstd.

The gate electrode 124, the first source electrode 173a, the first drain electrode 175a, and the first semiconductor 154a form the first thin film transistor, the gate electrode 124, the second source electrode 173b, the second drain electrode 175b, and the second semiconductor 154b form the second thin film transistor, and the third gate electrode 124c, the third source electrode 173c, the third drain electrode 175c, and the third semiconductor 154c form the third thin film transistor.

The channels of the thin film transistors are formed in the semiconductor 154a between the first source electrode 173a and the first drain electrode 175a, the semiconductor 154b between the second source electrode 173b and the second drain electrode 175b, and the semiconductor 154c between the third source electrode 173c and the third drain electrode 173c.

The semiconductors 154 and 154c including the first to third semiconductors 154a, 154b, and 154c except for the channel region between the first to third source electrodes 173a-173c, and the first to third drain electrodes 175a-175c have substantially the same plane shape as the first to third source electrodes 173-173c, the first to third drain electrodes 175a-175c, and the data line 171.

However, when forming and patterning by using separate photosensitive films for each layer, they may have different shapes, as shown in FIG. 3 and FIG. 4.

A passivation layer (not shown) having contact holes 185a and 185b is formed on the first to third source electrodes 173a-173c and the first to third drain electrodes 175a-175c.

A pixel electrode 191 including the first subpixel electrode 191a and the second subpixel electrode 191b (where latter has positionally separate sections 191ba and 191bb) is formed on the passivation layer.

Like the exemplary embodiment of FIG. 17, the second subpixel electrode 191b includes the second subpixel electrode 191ba and the second subpixel electrode 191bb that are disposed upward and downward with respect to the first subpixel electrode 191a. The upper and lower second subpixel electrodes 191ba and 191bb are connected to each other by the branch 196.

The first subpixel electrode 191a is connected to the first drain electrode 175a through the contact hole 185a, and the second subpixel electrode 191b is connected to the second drain electrode 175b through the contact hole 185b.

Figure 21:
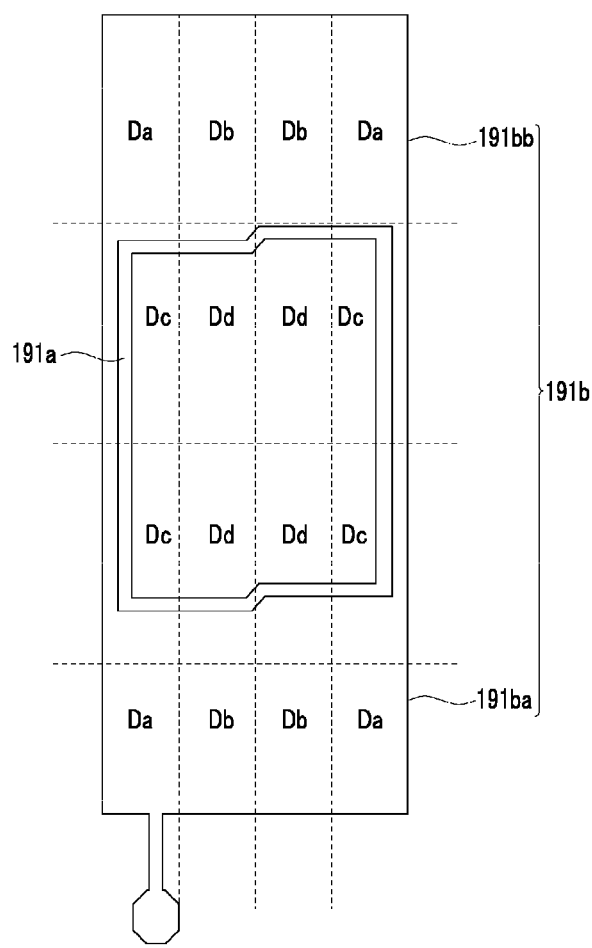
FIG. 21 is a view showing the pixel electrode and the sub-region of FIG. 20 to explain photoalignment of a liquid crystal display according to an exemplary embodiment.

As described above, the liquid crystal display may include a plurality of sub-regions aligned in various directions, as shown in FIG. 21.

FIG. 21 is a view showing the pixel electrode and the sub-region of FIG. 20 to explain photoalignment of a liquid crystal display according to an exemplary embodiment.

As shown in FIG. 21, when photo-aligning according to the photoalignment method of FIG. 3 and FIG. 4, the first subpixel electrode 191a includes the sub-regions Dc and Dd and the second subpixel electrode 191b includes the sub-regions Da and Db.

Figure 22:
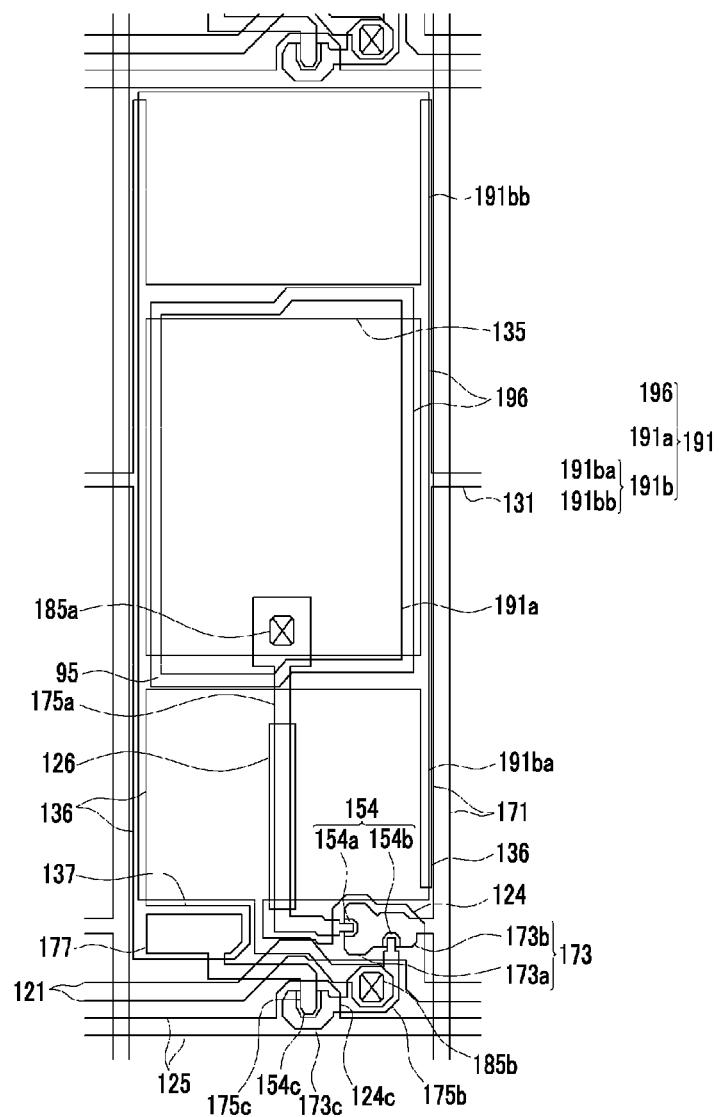
FIG. 22 is a view of a thin film transistor array panel for a liquid crystal display according to an exemplary embodiment.

FIG. 22 is a view of a thin film transistor array panel for a liquid crystal display according to an exemplary embodiment. The layered structure of FIG. 22 is the almost the same as the exemplary embodiment of FIG. 20 such that only different portions will be mainly described.

Referring to FIG. 22, a plurality of gate lines 121 having a plurality of gate electrodes 124, a plurality of step-down gate lines 125 having a plurality of the third gate electrodes 124c, and a conductor 126 are formed on the substrate.

Also, a storage electrode line 131 having a plurality of storage electrodes 135 formed in the same direction as the gate line 121 is formed.

However, the exemplary embodiment of FIG. 22 does not include the step-down capacitor storage electrode line, and includes a pair of branches 136 extending according to the data line from the storage electrode 135, and one branch of two branches includes a step-down capacitor expansion 137 having an expanded end, differently from the exemplary embodiment of FIG. 20.

A gate insulating layer (not shown) is formed on the gate line 121, the step-down gate line 125, and the storage electrode line 131.

A semiconductor 154 including the first semiconductor 154a, the second semiconductor 154b, and the third semiconductor 154c are formed on the gate insulating layer. A plurality of ohmic contact stripes and ohmic contact islands (not shown) are formed on the semiconductor.

A plurality of data lines 171 including a source electrode 173 connected with the first source electrode 173a and the second source electrode 173b, a plurality of first drain electrodes 175a, a plurality of second drain electrodes 175b, and a plurality of third drain electrodes 175c are formed on the ohmic contact stripes and the ohmic contact islands. The first source electrode 173a and the second source electrode 173b are connected to each other like the exemplary embodiment of FIG. 3, however they may be separated from each other. One end of the second drain electrode 175b forms the third source electrode 173c of the third thin film transistor.

One end of the third drain electrode 175c is enclosed by the third source electrode 173c, and the other end 177 has a wide width thereby overlapping the step-down capacitor expansion 137 to form the step-down capacitor Cstd.

A passivation layer (not shown) having contact holes 185a and 185b is formed on the first to third source electrodes 173a-173c, and the first to third drain electrodes 175a-175c.

A pixel electrode 191 including the first subpixel electrode 191a and the second subpixel electrode 191b is formed on the passivation layer. The second subpixel electrode 191b includes the second subpixel electrode 191bb and the second subpixel electrode 191ba that are respectively disposed on the upper and lower portions of the first subpixel electrode 191a. The second subpixel electrodes 191ba and 191bb are connected by the branch 196.

The first subpixel electrode 191a is connected to the first drain electrode 175a through the contact hole 185a, and the second subpixel electrode 191b is connected to the second drain electrode 175b through the contact hole 185b.

The liquid crystal display including the thin film transistor array panel according to the exemplary embodiment of FIG. 22 may be aligned by the above-described photoalignment method.

Figure 23:
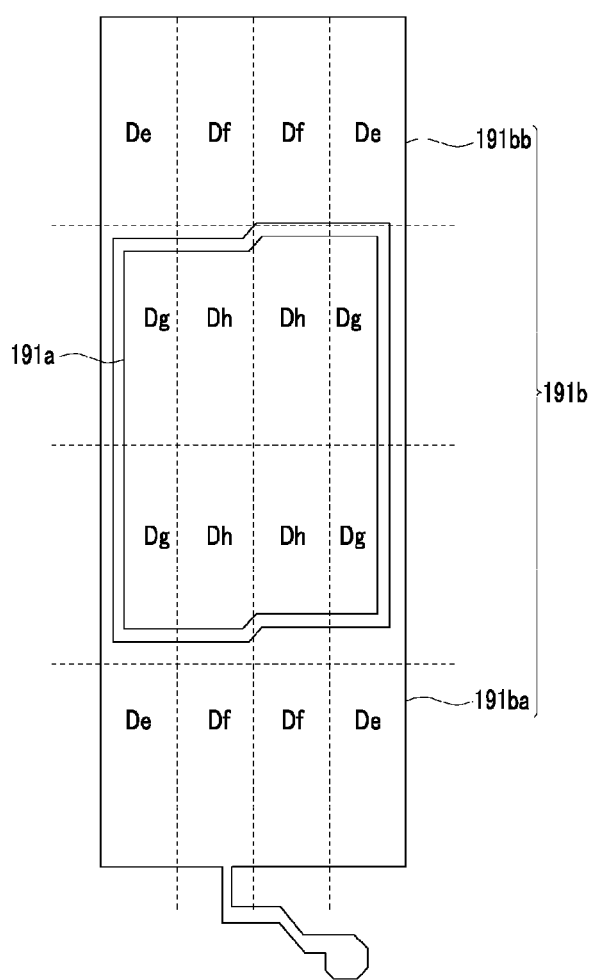
FIG. 23 is a view showing the pixel electrode and the sub-region of FIG. 22 to explain photoalignment of a liquid crystal display according to an exemplary embodiment.

FIG. 23 is a view showing the pixel electrode and the sub-region of FIG. 22 to explain photoalignment of a liquid crystal display according to an exemplary embodiment.

As shown in FIG. 23, when photo-aligning according to the photoalignment method for example of FIG. 10A to FIG. 11E, the first subpixel electrode 191a includes the sub-regions Dg and Dh, and the sub-regions De and Df are positioned at the location of the second subpixel electrode 191b having the lower and upper second subpixel electrodes 191ba and 191bb.

While this disclosure of invention has been described in connection with what are presently considered to be practical exemplary embodiments, it is to be understood that the present teachings are not limited to the disclosed embodiments, but, on the contrary, they are intended to cover various modifications and equivalent arrangements included within the spirit and scope of the teachings.

What is claimed is:
1. A method for photo-aligning an alignment layer, comprising:
firstly disposing a first mask including a divided region comprising a translucent region, a maximal transmission region, and a blocking region over a first alignment layer;

firstly irradiating UV rays to the first alignment layer through the first mask for an alignment in a first irradiation direction;

secondly disposing the first mask in a state that is different from the first disposing; and secondly irradiating UV rays to the first alignment layer through the first mask for alignment in a second irradiation direction, wherein the first mask for the firstly irradiating and the first mask for the secondly irradiating totally overlap each other, and wherein transmittance of the translucent region is a value in the range of 25%-50%.

2. The method of claim 1, wherein the first irradiation direction and the second irradiation direction are opposite to each other.

3. The method of claim 2, wherein the translucent region and the maximal transmission region of the first mask in the second disposing are disposed at the position of the blocking region of the first mask in the first disposing.

4. The method of claim 1 and further comprising:
thirdly disposing a second mask including a translucent region, a maximal transmission region, and a blocking region over a second alignment layer;

thirdly irradiating UV rays to the second alignment layer through the second mask for an alignment in a third irradiation direction;

fourthly disposing the second mask differently from the third disposing; and fourthly irradiating UV rays to the second alignment layer through the second mask for aligning in a fourth irradiation direction, wherein the third irradiation direction and the fourth irradiation direction are perpendicular to the first irradiation direction and the second irradiation direction in the state in which the first alignment layer and the second alignment layer are combined to form a Liquid Crystal Display (LCD) device.

5. The method of claim 4, wherein the third irradiation direction and the fourth irradiation direction are opposite to each other.

6. The method of claim 4, wherein the UV rays applied to the masks are linearly polarized ultraviolet rays or partially polarized UV rays.

7. The method of claim 6, wherein the wavelengths of the applied UV rays is in the range of 270 nm-360 nm, and the irradiation energy of the applied UV rays is in the range of 10 mJ-5000 mJ.

8. A method for photo-aligning an alignment layer comprising:
firstly disposing a first mask including a first maximal transmission region and a first blocking region over a first alignment layer, the first maximal transmission region being at least partially surrounded by the first blocking region;

secondly disposing a second mask including a second maximal transmission region and a first translucent region for the second maximal transmission region and the first translucent region to overlap the first maximal transmission region and the first blocking region, wherein the second maximal transmission region being at least partially surrounded by the first translucent region;

irradiating UV rays toward the first alignment layer and through the first and second overlapped masks for thereby photoaligning the first alignment layer in accordance with a first irradiation direction;

thirdly disposing the first mask in a state that is different from the first disposing;

disposing the first mask and the second mask to overlap the first maximal transmission region and the blocking region of the first mask with the second maximal transmission region and the translucent region of the second mask, and fourthly disposing the second mask in a different state from that of the second disposing; and secondly irradiating UV rays toward the first alignment layer and through the first and second masks to thereby photoalign the first alignment layer in the second irradiation direction.

9. The method of claim 8, wherein the first irradiation direction and the second irradiation direction are opposite to each other.

10. The method of claim 8, further comprising:
fifthly disposing a third mask including a third maximal transmission region and a second blocking region on the second alignment layer;

sixthly disposing a fourth mask including the fourth maximal transmission region and the second translucent region for the fourth maximal transmission region and the second translucent region to overlap the third maximal transmission region and the second blocking region;

thirdly irradiating UV rays to on the second alignment layer through the third and fourth masks to align the second alignment layer in the third irradiation direction;

seventhly disposing the third mask in a different state from that of the fifth disposing;

disposing the third maximal transmission region and the second blocking region of the third mask to overlap the fourth maximal transmission region and the second translucent region of the fourth mask, and eighthly disposing the fourth mask in a state that is different from the sixth disposing; and fourthly irradiating UV rays to the second alignment layer through the third and fourth masks to align the second alignment layer in the fourth irradiation direction.

11. The method of claim 10, wherein the third irradiation direction and the fourth irradiation direction are opposite to each other.

12. The method of claim 11, wherein the third irradiation direction and the fourth irradiation direction are perpendicular to the first irradiation direction and the second irradiation direction.

13. The method of claim 10, wherein the UV rays applied to the masks are linearly polarized UV rays or partially polarized UV rays.

14. The method of claim 13, wherein the wavelengths of the applied UV rays include those is in the range of 270 nm-360 nm.

* * * * *